United States Patent
Ogomi et al.

(10) Patent No.: US 10,564,228 B2
(45) Date of Patent: Feb. 18, 2020

(54) MAGNETORESISTIVE EFFECT ELEMENT UNIT AND MAGNETORESISTIVE EFFECT ELEMENT DEVICE

(71) Applicant: Mitsubishi Electric Corporation, Chiyoda-ku (JP)

(72) Inventors: Tomokazu Ogomi, Chiyoda-ku (JP); Kenji Shimohata, Chiyoda-ku (JP); Jin Inoue, Chiyoda-ku (JP); Tetsuji Imamura, Toyama (JP); Yoshinori Yamaguchi, Toyama (JP); Takashi Daimon, Toyama (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/332,895

(22) PCT Filed: Jan. 15, 2018

(86) PCT No.: PCT/JP2018/000818
§ 371 (c)(1),
(2) Date: Mar. 13, 2019

(87) PCT Pub. No.: WO2018/139233
PCT Pub. Date: Aug. 2, 2018

(65) Prior Publication Data
US 2019/0204396 A1 Jul. 4, 2019

(30) Foreign Application Priority Data

Jan. 27, 2017 (JP) .................. 2017-012689

(51) Int. Cl.
*G01R 33/09* (2006.01)
*H01L 43/08* (2006.01)
*H01L 43/10* (2006.01)

(52) U.S. Cl.
CPC .......... *G01R 33/096* (2013.01); *G01R 33/09* (2013.01); *H01L 43/08* (2013.01); *H01L 43/10* (2013.01)

(58) Field of Classification Search
CPC .... G01R 33/09; G01R 33/096; G01R 33/091; B82Y 25/00; H01L 43/08; H01L 43/10
See application file for complete search history.

(56) References Cited

U.S. PATENT DOCUMENTS 5,500,590 A 3/1996 Pant
5,521,501 A 5/1996 Dettmann et al.
(Continued)

FOREIGN PATENT DOCUMENTS

JP 4-282480 A 10/1992
JP 8-503778 A 4/1996
(Continued)

OTHER PUBLICATIONS

International Search Report dated Feb. 20, 2018 in PCT/JP2018/000818 filed on Jan. 15, 2018.
(Continued)

*Primary Examiner* — Son T Le
*Assistant Examiner* — Dustin R Dickinson
(74) *Attorney, Agent, or Firm* — Oblon, McClelland, Maier & Neustadt, L.L.P.

(57) ABSTRACT

The magnetoresistive effect element unit includes an anisotropic magnetoresistive effect element and a conductive reset line that, as viewed in a direction orthogonal to both a magnetic sensing direction x' and an easy magnetization direction y' of the anisotropic magnetoresistive effect element, passes through a center of the anisotropic magnetoresistive effect element, extends in a direction inclined from the easy magnetization direction y' so as to form an angle of 45° or less with the easy magnetization direction y', and is
(Continued)

parallel to a plane including the magnetic sensing direction x' and the easy magnetization direction y'. As viewed in the direction orthogonal to both the magnetic sensing direction x' and the easy magnetization direction y', the reset line has a width that covers an entirety of the anisotropic magnetoresistive effect element.

16 Claims, 14 Drawing Sheets

(56) References Cited

U.S. PATENT DOCUMENTS

| | | | |
|---|---|---|---|
| 5,952,825 | A | 9/1999 | Wan |
| 7,394,248 | B1 | 7/2008 | Guo et al. |
| 2009/0206833 | A1 | 8/2009 | Imai et al. |
| 2010/0013471 | A1 | 1/2010 | Boeve et al. |
| 2013/0127457 | A1* | 5/2013 | Musha .................. B82Y 25/00 324/252 |
| 2014/0300348 | A1* | 10/2014 | Deak .................. G01R 33/0035 324/202 |

FOREIGN PATENT DOCUMENTS

| | | |
|---|---|---|
| JP | 2001-516031 A | 9/2001 |
| JP | 2009-36770 A | 2/2009 |
| JP | 2009-192429 A | 8/2009 |
| JP | 2014-532883 A | 12/2014 |

OTHER PUBLICATIONS

Shimoe, O. et al., "Magnetic Compass using Magneto-resistive device", Hitatchi Metals Technical Review, vol. 18, 2002, pp. 37-42.

* cited by examiner

MAGNETORESISTIVE EFFECT ELEMENT UNIT AND MAGNETORESISTIVE EFFECT ELEMENT DEVICE

TECHNICAL FIELD

The present disclosure relates to a magnetoresistive effect element unit and a magnetoresistive effect element device that detect a magnetic pattern.

BACKGROUND ART

When a magnetic sensor using an anisotropic magnetoresistive effect element is exposed to a strong magnetic field, a magnetization direction of the element may become destabilized, and output of the element may be affected. In order that the magnetization direction of the element is directed in a prescribed direction, the magnetization direction of the element is forcefully aligned by a reset current prior to measurement (Non-patent Literature 1).

For example, Patent Literature 1 includes a description of an integrated-type magnetic field detection device that has a magnetic field detection element forming a bridge circuit. In the integrated magnetic field detection device of Patent Literature 1, a first spiral-shaped coil has a set-reset function. A second coil and a third coil are configured to generate magnetic fields capable of use for testing, compensation, calibration, and feedback.

CITATION LIST

Patent Literature

Patent Literature 1: National Patent Publication No. 2001-516031
Non-patent Literature 1: Hitachi Metals Technical Review, Vol. 18 (2002), pp. 37 to 42

SUMMARY OF INVENTION

Technical Problem

The integrated-type magnetic field detection device of Patent Literature 1 is equipped with a spiral-shaped conductor, as a reset coil, winding in a clockwise direction from an outer perimeter toward a center of the magnetoresistive element. By flow of current in the reset coil, a magnetic field is generated toward a chip central part, and the magnetoresistive element of Patent Literature 1 is reset. However, line width of the reset coil is required in this configuration to be quite small in comparison to length of the magnetoresistive element, and the reset coil is arranged in the spiral shape, and thus pattern resistance of the reset coil is high, and this configuration suffers from a requirement for high reset voltage per element when current flows in the reset coil to reset the element.

In order to solve problems such as those described above, an objective of the present disclosure is to decrease the reset voltage per anisotropic magnetoresistive effect element.

Solution to Problem

A magnetoresistive effect element unit according to the present disclosure includes: a first anisotropic magnetoresistive effect element; a conductive first reset line that, as viewed in a direction orthogonal to both a magnetic sensing direction and an easy magnetization direction of the anisotropic magnetoresistive effect element, passes through a center of the anisotropic magnetoresistive effect element, extends in a direction inclined from the easy magnetization direction so as to form an angle of 45° or less with the easy magnetization direction, and is parallel to a plane including the magnetic sensing direction and the easy magnetization direction, and has a width that covers an entirety of the first anisotropic magnetoresistive effect element. The magnetoresistive effect element unit further includes: a second anisotropic magnetoresistive effect element disposed, in a plane including the magnetic sensing direction and the easy magnetization direction of the first anisotropic magnetoresistive effect element, at a position in a direction perpendicular the direction of extension of the first reset line of the first anisotropic magnetoresistive effect element, and in parallel with the first anisotropic magnetoresistive effect element; and a conductive second reset line that, as viewed in the direction orthogonal to both the magnetic sensing direction and the easy magnetization direction of the first anisotropic magnetoresistive effect element, passes through a center of the second anisotropic magnetoresistive effect element, is parallel to the first reset line, and has a width that covers an entirety of the second anisotropic magnetoresistive effect element. The first anisotropic magnetoresistive effect element is bridge-connected to the second anisotropic magnetoresistive effect element.

Advantageous Effects of Invention

According to the present disclosure, the magnetoresistive effect element unit is equipped with the conductive reset line that, as viewed in the direction orthogonal to both a magnetic sensing direction and an easy magnetization direction of the anisotropic magnetoresistive effect element, passes through a center of the anisotropic magnetoresistive effect element, and extends in a direction inclined from the easy magnetization direction so as to form an angle of 45° or less with the easy magnetization direction, and the reset line has a width that covers an entirety of the anisotropic magnetoresistive effect element. Thus a reset magnetic field can be applied to the anisotropic magnetoresistive effect element in a direction orthogonal to the reset line, and the reset voltage per anisotropic magnetoresistive effect element can be made small.

DESCRIPTION OF EMBODIMENTS

Embodiment 1

Figure 1:
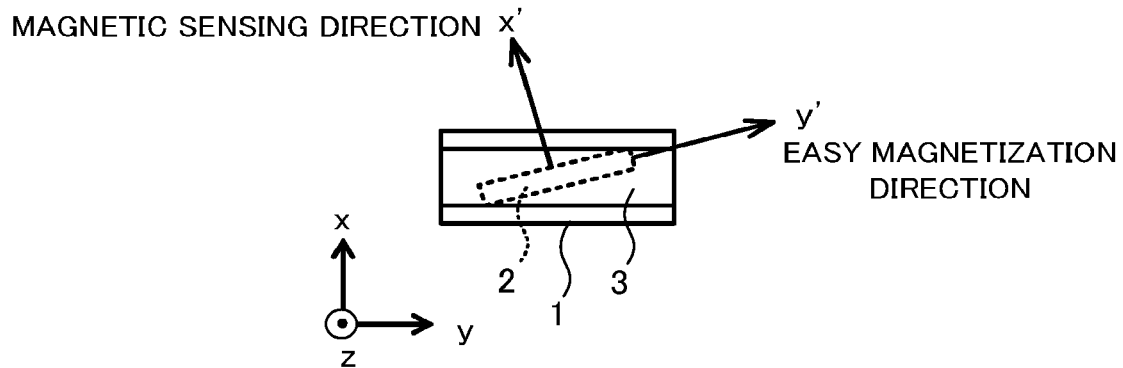
FIG. 1 is a plan view of a magnetoresistive effect element unit according to Embodiment 1 of the present disclosure.

FIG. 1 is a plan view of a magnetoresistive effect element unit according to Embodiment 1 of the present disclosure. The magnetoresistive effect element unit 1 is equipped with an anisotropic magnetoresistive effect element 2 and a reset line 3. Hereinafter, the magnetoresistive effect element unit 1 is sometimes referred to simply as a "unit 1", and the anisotropic magnetoresistive effect element 2 is sometimes referred to simply as an "element 2".

The element 2 has a generally elongated rectangular shape, and due anisotropic morphology, has a magnetic sensing direction x' and an easy magnetization direction y'. In the case illustrated in FIG. 1, the magnetic sensing direction x' is the direction perpendicular to the longitudinal direction in plan view, that is to say, is the transverse direction; and the easy magnetization direction y' is the longitudinal direction. FIG. 1 is a view as seen in a direction orthogonal to both the magnetic sensing direction x' and the easy magnetization direction y' of the element 2.

The reset line 3 is formed by a conductor, and as viewed in a direction orthogonal to both the magnetic sensing direction x' and the easy magnetization direction y' of the element 2, that is, as viewed in a direction perpendicular to the page surface of FIG. 1, the reset line 3 passes through the center of the element 2 and extends in a direction inclined from the easy magnetization direction y' so as to form an angle of 45° or less with the easy magnetization direction y'. The reset line 3 is parallel to a plane including the magnetic sensing direction x' and the easy magnetization direction y'. As viewed in the direction orthogonal to both the magnetic sensing direction x' and the easy magnetization direction y' of the element 2, the reset line 3 has a width that covers an entirety of the element 2.

Here, the direction of extension of the reset line 3 is taken to be the y axis, and in the plane that includes the magnetic sensing direction x' and the easy magnetization direction y', the direction orthogonal to the y axis is taken to be the x axis. The direction orthogonal to both the x axis and the y axis, that is, the direction orthogonal to both the magnetic sensing direction x' and the easy magnetization direction y' of the element 2, is the z axis. As illustrated in FIG. 1, the positive x-axis direction is taken to be upward, the positive y-axis direction is taken to be rightward, and the positive z-axis direction is taken to be the direction from the back surface of the page toward the front surface of the page.

In FIG. 1, the terminals for applying a voltage to the element 2 of the unit 1 and the terminals for supplying current to the reset line 3 are omitted. Current flowing in the extension direction, that is, in the y-axis direction, is supplied to the reset line 3.

Figure 2A:
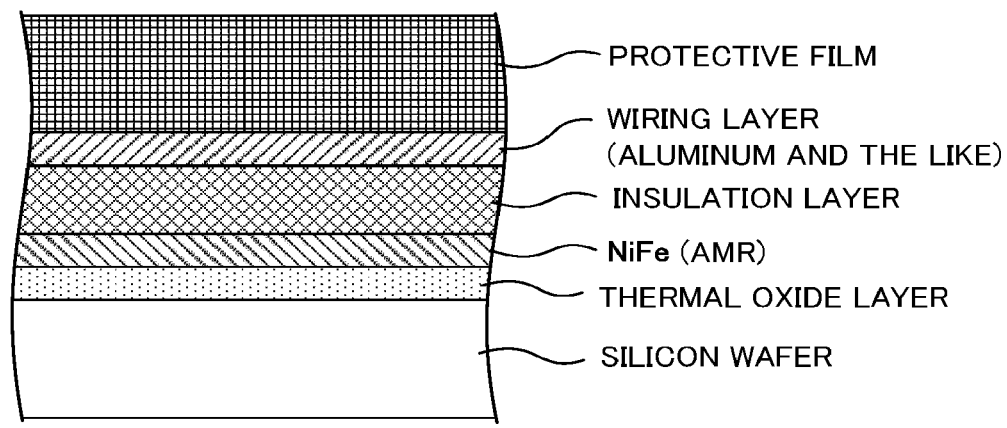
FIG. 2A illustrates a layer structure of the magnetoresistive effect element unit according to Embodiment 1.

FIG. 2A illustrates a layer structure of the magnetoresistive effect element unit according to Embodiment 1. The unit 1 is formed by stacking upon a substrate formed of glass or silicon, such as a silicon wafer, in order from the bottom: a thermal oxide layer; NiFe forming the element 2; an insulation layer formed of alumina, for example, to insulate the NiFe from the wiring layer; a wiring layer forming the reset line 3; and a protective film. FIG. 1 is a view as seen from the wiring layer side in a state in which the protective film is removed. Further, in FIG. 2A, the layers of the terminals for applying voltage to the element 2 of the unit 1 and the layers of the terminal parts for supplying current to the reset line 3 are omitted.

Figure 2B:
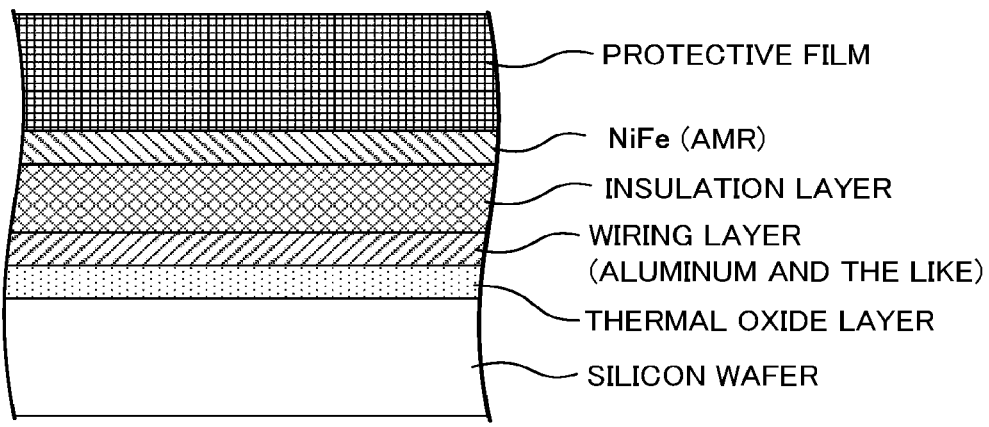
FIG. 2B illustrates a different layer structure of the magnetoresistive effect element unit according to Embodiment 1.

FIG. 2B illustrates a different layer structure of the magnetoresistive effect element unit according to Embodiment 1. Among the stacked layers of FIG. 2A, the NiFe and the wiring layer are exchanged in FIG. 2B. In the case of the layer structure of FIG. 2B, the element 2 is indicated by solid lines in FIG. 1, and the reset line 3 is indicated by dashed lines. Hereinafter, the magnetoresistive effect element unit of Embodiment 1 is described using the layer structure of FIG. 2A.

Figure 3:
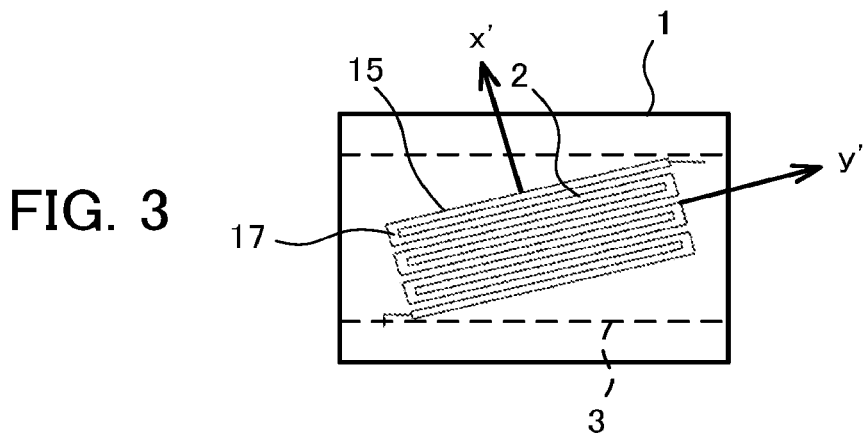
FIG. 3 illustrates a case in which the magnetoresistive effect element unit according to Embodiment 1 is formed by a folded-over line resistance pattern.

FIG. 3 illustrates a case in which the magnetoresistive effect element unit according to Embodiment 1 is formed by a folded-over line resistance pattern. The element 2 includes the resistance pattern of a folded-over bent line. The direction perpendicular to a linear pattern 15 of extension of the folded-over line is the magnetic sensing direction x', and the direction of extension of the linear pattern 15 is the easy magnetization direction y'. The unit 1 of FIG. 3 has the layer structure of FIG. 2B.

The element 2 of FIG. 3 includes linear patterns 15 having a fixed width and extending linearly in the easy magnetization direction y', and short connecting patterns 17 that alternatingly connect together adjacent linear patterns 15 at the ends of the linear patterns 15. The spacing between each pair of adjacent linear patterns 15 is fixed. The length of the linear patterns 15, for example, is about 400 μm. In the example of FIG. 3, the element 2 includes seven linear patterns 15 and six connecting patterns 17. The number of linear patterns 15 included in the element 2 is not limited to seven.

Figure 4:
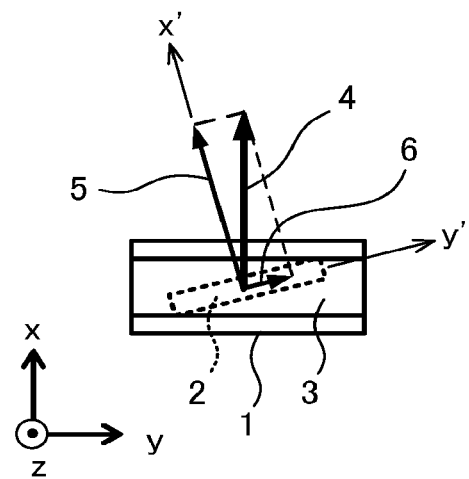
FIG. 4 illustrates a bias magnetic flux vector of the magnetoresistive effect element unit according to Embodiment 1.

FIG. 4 illustrates a bias magnetic flux vector of the magnetoresistive effect element unit according to Embodiment 1. In unit 1, the bias magnetic field is applied, for example, in the x-axis direction. When the bias magnetic field is applied, a bias magnetic flux vector 4 can be resolved into an x' component 5 in the magnetic sensing direction x' of the element 2 and a y' component 6 in the easy magnetization direction y'.

Figure 5A:
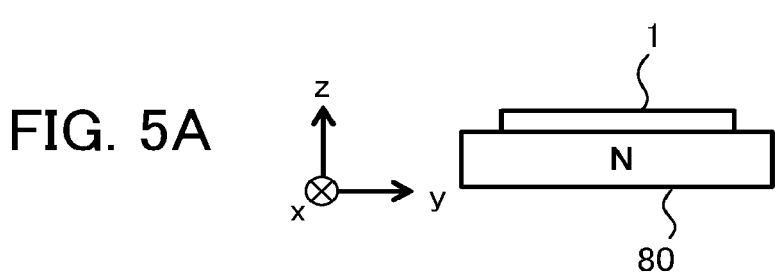
FIG. 5A is a side view illustrating an example of a magnetic circuit applying a bias magnetic field to the magnetoresistive effect element unit according to Embodiment 1.
Figure 5B:
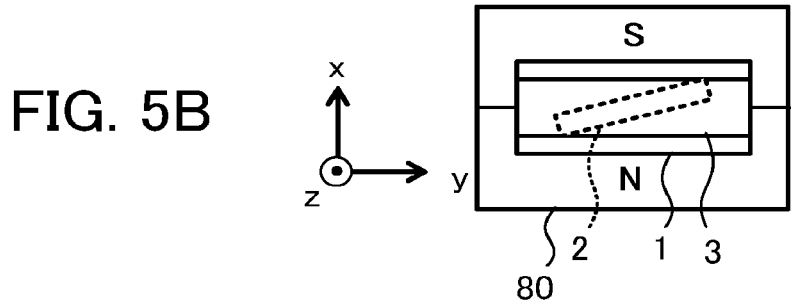
FIG. 5B is a plan view illustrating the example of the magnetic circuit applying the bias magnetic field to the magnetoresistive effect element unit according to Embodiment 1.

FIG. 5A is a side view illustrating an example of a magnetic circuit applying the bias magnetic field to the magnetoresistive effect element unit according to Embodiment 1. FIG. 5B is a plan view illustrating the example of the magnetic circuit applying the bias magnetic field to the magnetoresistive effect element unit according to Embodiment 1. By arrangement of a magnet 80 magnetized in the x-axis direction on the bottom side of the unit 1, the bias magnetic field illustrated in FIG. 4 can be applied to the element 2. Although in FIGS. 5A and 5B an example is illustrated of a configuration in which the magnet 80 magnetized in the x-axis direction is arranged below the unit 1, such configuration is not limiting, and any configuration can be used as long as the bias magnetic field indicated by the bias magnetic flux vector 4 can be applied. For example, a similar effect is obtained also by arranging a magnet magnetized in the z-axis direction below the unit 1 at a position offset from the center of the x axis.

Figure 6:
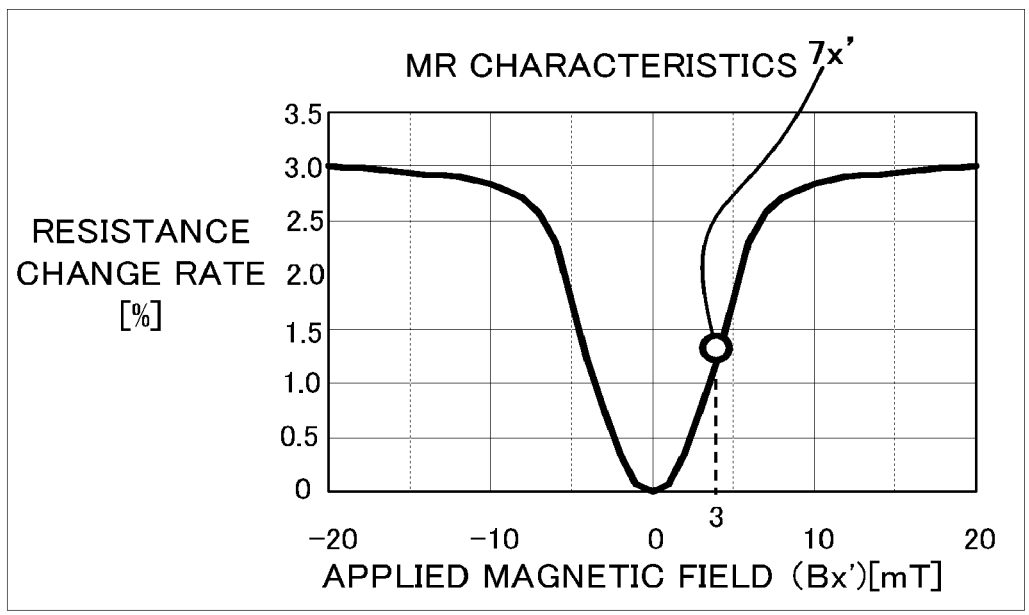
FIG. 6 is a graph illustrating an example of MR characteristics of an anisotropic magnetoresistive effect element.

FIG. 6 is a graph illustrating an example of MR characteristics of an anisotropic magnetoresistive effect element. The horizontal axis of FIG. 6 indicates a strength Bx' of the magnetic field applied in the magnetic sensing direction x', and the vertical axis indicates the resistance change rate of the element 2. Generally in the case of use of the magnetoresistive effect element as a sensor for sensing of a magnetic pattern on paper currency or negotiable securities, the bias magnetic field is applied in a range of highest sensitivity of the magnetoresistive effect element, and the magnetic pattern is read. In FIG. 6 the bias magnetic field is applied in a range at which the slope is maximum, that is, in the range where the strength of the applied magnetic field is 1 to 6 mT. The applied bias magnetic field is indicated by a bias point 7x', for example.

Figure 7:
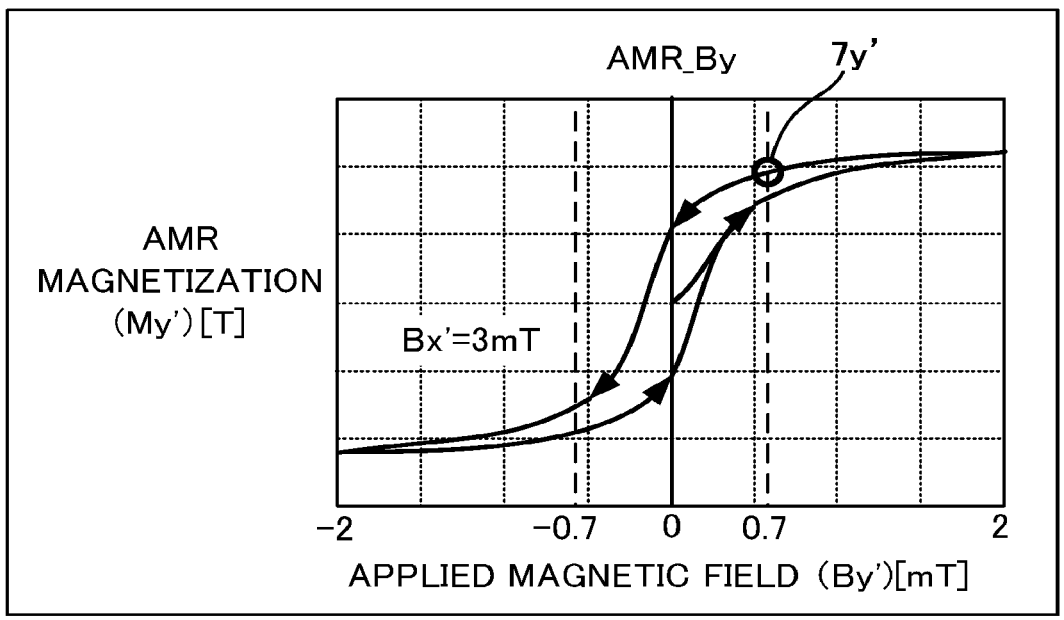
FIG. 7 illustrates an example of magnetization characteristics of an easy magnetization direction of the anisotropic magnetoresistive effect element.

FIG. 7 illustrates an example of magnetization characteristics of an easy magnetization direction of the anisotropic magnetoresistive effect element. The element 2 is a magnetic member, and thus the magnetization characteristics include hysteresis. For example, when the strength of the applied magnetic field is increased from zero in the positive direction to reach the saturation magnetic field and then the applied magnetic field is decreased, the magnetization after saturation magnetization traces the upper curve illustrated in FIG. 7. In the interval in which the strength of the applied magnetic field is in the positive range after decreasing from the saturation magnetic field, the magnetization is positioned on the upper curve illustrated in FIG. 7. For the easy magnetization direction y', the element 2 requires setting of the bias magnetization on the curve returning from the saturation magnetization of the magnetization characteristics. For example, the bias magnetization is set to a bias point 7y' of the curve illustrated in FIG. 7.

In order to satisfy the aforementioned bias magnetic field and bias magnetization conditions, as illustrated in FIG. 4, the element 2 is arranged at an angle relative to the bias magnetic flux vector 4. Due to arrangement as illustrated in FIG. 4, the bias magnetic field is applied to the element 2 in the magnetic sensing direction x', and the magnetic field is applied in the direction determined for the easy magnetization direction y', and thus the bias conditions can be satisfied.

Figure 8:
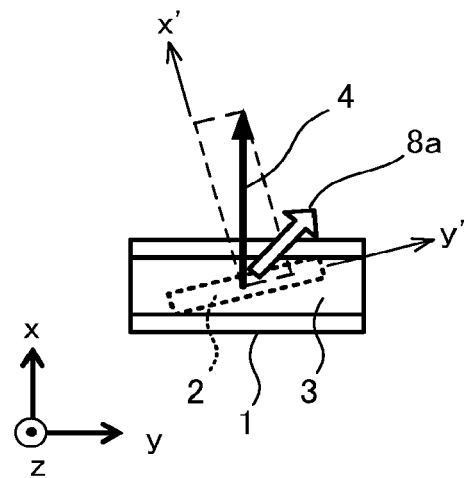
FIG. 8 illustrates a direction of magnetization that satisfies bias conditions for the anisotropic magnetoresistive effect element according to Embodiment 1.

FIG. 8 illustrates a direction of magnetization that satisfies the bias conditions for the anisotropic magnetoresistive effect element according to Embodiment 1. A magnetization 8*a* of FIG. 8 indicates the direction of magnetization of the element 2 under conditions that satisfy the bias point 7*x*' and the bias point 7*y*'.

Figure 9:
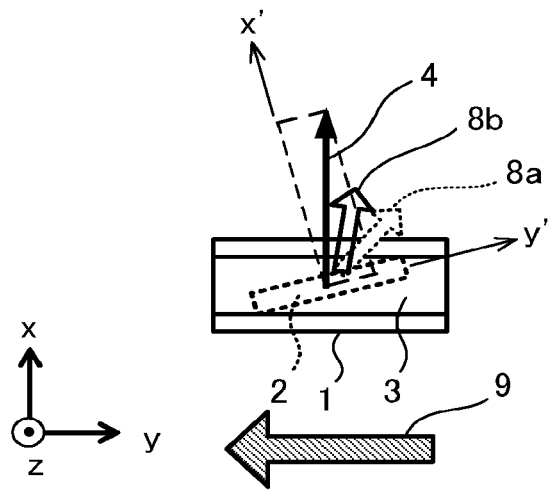
FIG. 9 illustrates a direction of magnetization in a state in which a strong external disturbing magnetic field is applied to the anisotropic magnetoresistive effect element according to Embodiment 1 orthogonally to the bias magnetic flux.

FIG. 9 illustrates a direction of magnetization in a state in which a strong external disturbing magnetic field is applied to the anisotropic magnetoresistive effect element according to Embodiment 1 orthogonally to the bias magnetic flux. When the strong external disturbing magnetic field 9 is applied in the negative y-axis direction, the direction of magnetization of the element 2 changes to the magnetization 8*b* from the state illustrated in FIG. 8.

Figure 10:
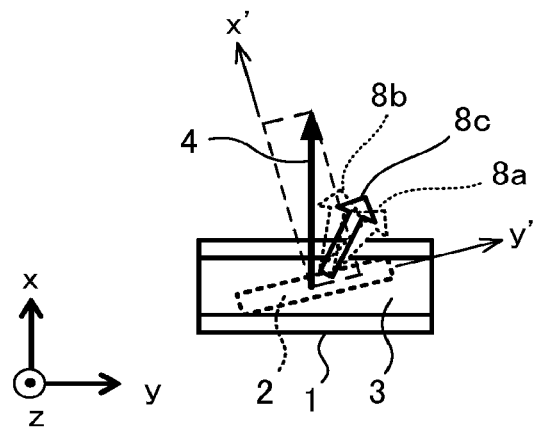
FIG. 10 illustrates a direction of magnetization of the anisotropic magnetoresistive effect element after stoppage of the external disturbing magnetic field of the state illustrated in FIG. 9.

FIG. 10 illustrates a direction of magnetization of the anisotropic magnetoresistive effect element after stoppage of the external disturbing magnetic field of the state illustrated in FIG. 9. When the external disturbing magnetic field 9 stops after the state illustrated in FIG. 9, the direction of magnetization of the element 2 stays at a magnetization 8*c* tilted from the magnetization 8*a* toward the negative y-axis direction.

Figure 11:
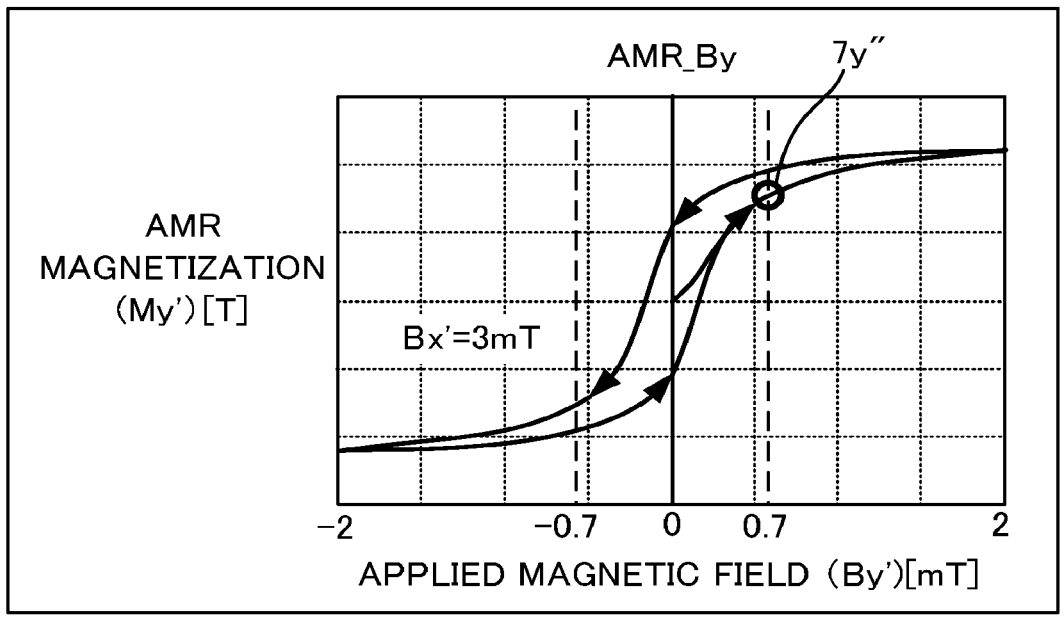
FIG. 11 illustrates a bias point of the easy magnetization direction of the anisotropic magnetoresistive effect element in the state illustrated in FIG. 10.

FIG. 11 illustrates a bias point of the easy magnetization direction of the anisotropic magnetoresistive effect element in the state illustrated in FIG. 10. In the state of FIG. 10, even when the bias magnetic field is the same, the bias magnetization of the easy magnetization direction y' of the magnetization 8*c* is positioned at a bias magnetization 7*y*''' on the bottom curve of the magnetization characteristics. In this state, the magnitude (resistivity) of the magnetization of the element 2 when the magnetic pattern is conveyed changes each time, and stabilized correct output cannot be obtained. In order to obtain stabilized correct output, whatever the strong magnetic field applied from the outside is, a procedure is required for returning to the original bias point (FIG. 7). Thus once operation occurs at a magnetization up to the saturation magnetization, return of the magnetization to the top curve illustrated in FIG. 11 is required.

Figure 12:
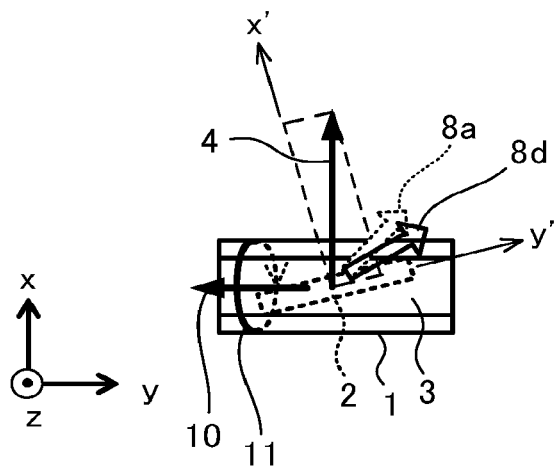
FIG. 12 illustrates a direction of magnetization in a state in which the reset magnetic field is applied to the magnetoresistive effect element unit in the state illustrated in FIG. 10.

FIG. 12 illustrates a direction of magnetization in the state in which the reset magnetic field is applied to the magnetoresistive effect element unit in the state illustrated in FIG. 10. When a reset current 10 of, for example, a current of several hundred milliamps is passed through the reset line 3 in the negative y-axis direction, a clockwise-directed magnetic field 11 is generated around the reset line 3 as viewed in the direction of the reset current 10. Due to location of the element 2 at the bottom side of the reset line 3, a reset magnetic field in the negative x-axis direction is applied by the magnetic field 11 to the element 2. At this time, the magnetization of the element 2 rotates so as to approach the positive y-axis direction from the magnetization 8*c* of FIG. 10, exceeds the magnetization 8*a*, and arrives at the magnetization 8*d* that is the saturation magnetization of the easy magnetization direction y'.

Figure 13:
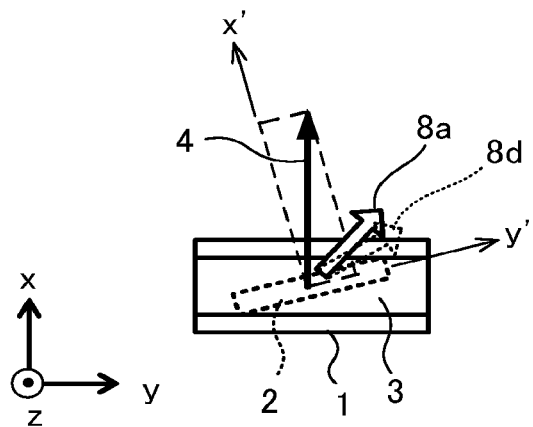
FIG. 13 illustrates a direction of magnetization of the anisotropic magnetoresistive effect element after stoppage of the reset magnetic field of the state illustrated in FIG. 12.

FIG. 13 illustrates a direction of magnetization of the anisotropic magnetoresistive effect element after stoppage of the reset magnetic field of the state illustrated in FIG. 12. Upon disappearance of the magnetic field 11, magnetization of the element 2 returns to the magnetization 8*a* that satisfies the bias conditions of FIG. 8. After once becoming the positive saturation magnetization, the magnetization of the easy magnetization direction of the element 2 returns to the bias point '7*y*' on the upper curve in FIG. 7.

In the case of the layer structure of the unit 1 as illustrated in FIG. 2B, due to arrangement of the reset line 3 on the back surface side of the element 2, for the same bias magnetic field and bias conditions, the direction of the reset current 10 for applying the reset magnetic field in the negative x-axis direction is the reverse of the direction illustrated in FIG. 12, that is, is in the positive y-axis direction.

In the case of such an abnormal state, by flow of the reset current 10 in the reset line 3, the bias point of the easy magnetization direction y' of the element 2 is positioned on the curve returning from the saturation magnetization, thereby enabling setting of the element 2 to a magnetization that satisfies the bias conditions. This enables the obtaining of output that is always stabilized and accurate. The reset line 3 is at least as wide as the width of the element 2, and thus the voltage for causing flow of the reset current 10 is smaller than the voltage for causing flow of the reset current in the reset coil of Patent Literature 1.

Further, causing flow of the required current as the reset current 10 for even an instant is sufficient. Further, in the case of positioning at the normal bias point 7*y*', even after causing flow of the reset current 10, the magnetization returns to the bias point 7*y*', and thus the element 2 is unaffected by the reset current 10.

Figure 14:
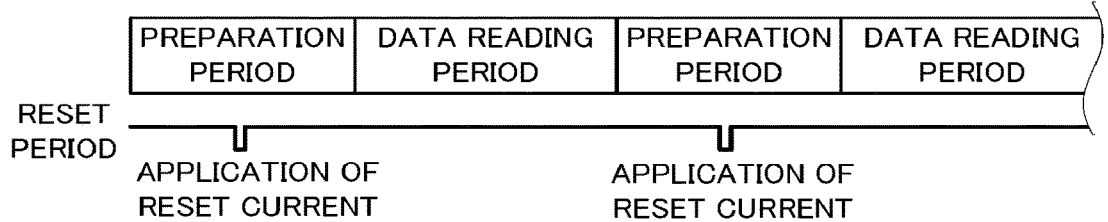
FIG. 14 illustrates timing of application of a reset current to the magnetoresistive effect element unit according to Embodiment 1.

FIG. 14 illustrates timing of application of the reset current to the magnetoresistive effect element unit according to Embodiment 1. By adopting a configuration such that the reset current flow 10 is a pulsed current, and for example, flows each time prior to a data reading period as illustrated in FIG. 14, a state is attainable in which accurate output is always obtainable during detection.

Figure 15:
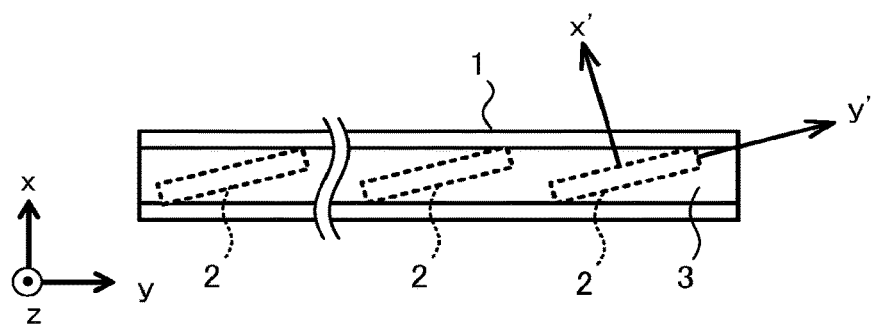
FIG. 15 is a plan view in which anisotropic magnetoresistive effect elements according to Embodiment 1 are arranged in an array.

FIG. 15 is a plan view in which anisotropic magnetoresistive effect elements according to Embodiment 1 are arranged in an array. In the unit 1 of FIG. 15, two or more elements 2 are arranged parallel each other and in an array to the direction of the reset line 3. Further, the reset lines 3, each of the two or more elements 2, are joined along a straight line. In the case of three or more of the elements 2, for general applications, the spacings of adjacent elements 2 are preferably equal. Depending on the application, the spacing between the elements 2 may be varied in accordance with the targeted magnetic pattern.

For the unit 1 of FIG. 15, the bias magnetic field is applied so as to be the same for all the elements 2, and the bias conditions are the same. The reset current 10 for resetting the element 2 is the same for all the elements 2. The reset line 3 connects in series all of the elements 2, and thus all the elements 2 are reset when the reset current 10 flows once in the reset line 3. That is, resetting the elements 2 one at a time is not required, and by simply causing the reset current 10 to flow once through the entire unit 1, the magnetization can be set so as to satisfy the bias conditions. When the number of the elements 2 is high, due to lengthening of the reset line 3, the voltage for causing the reset current 10 to flow becomes high, although the voltage per element 2 does not change from the case of the single element 2.

Further, a magnetoresistive effect element device can be configured in which multiple magnetoresistive effect element units 1 are connected together. In this case, the reset lines 3 of the units 1 can be interconnected, for example, in parallel, in series, or by a combination of in parallel and in series, thereby enabling the simultaneous flow of the reset current. In the magnetoresistive effect element device, the units 1 can be arranged in any manner in accordance with the application. For example, the units 1 can be arranged so that the elements 2 of each unit 1 are lined up along the same straight line, for example. Multiple units 1 can be divided into two groups, and for example, the units 1 of the two groups can be arranged in parallel to each other, or can be arranged alternately.

Embodiment 2

Figure 16:
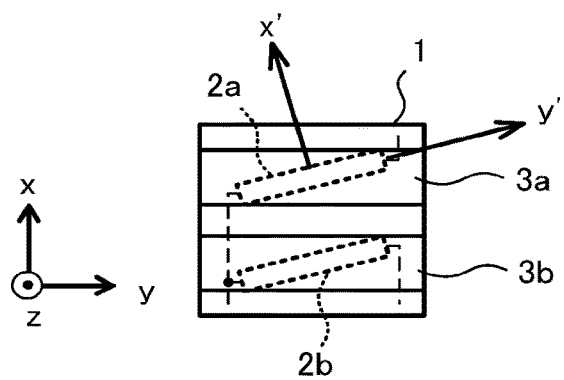
FIG. 16 is a plan view of a magnetoresistive effect element unit according to Embodiment 2 of the present disclosure.

FIG. 16 is a plan view of a magnetoresistive effect element unit according to Embodiment 2 of the present disclosure. The magnetoresistive effect element unit 1 of Embodiment 2 includes two anisotropic magnetoresistive effect elements 2a and 2b that are bridge-connected together. A reset line 3a is provided for the element 2a, and a reset line 3b is provided for the element 2b. The relationship between the element 2a and the reset line 3a and the relationship between the element 2b and the reset line 3b are the same as the relationship between the element 2 and the reset line 3 of Embodiment 1.

The second anisotropic magnetoresistive effect element 2b is arranged, within the plane that includes the magnetic sensing direction x' and the easy magnetization direction y' of the first magnetoresistive effect element 2a, in a direction perpendicular to the reset line 3a of the element 2a. The reset line 3b of the element 2b is parallel to the reset line 3a of the element 2a, and the elements 2a and 2b are parallel to each other. Use of the elements 2a and 2b bridge-connected together in Embodiment 2 has the effect of decreasing the effect of temperature variation and decreasing disturbing noise.

Also in Embodiment 2, the unit 1 has the layer structure of FIG. 2A or FIG. 2B. In FIG. 16, the layer structure is envisioned as being that of FIG. 2A. The element 2a and the element 2b may have configurations using the folded-over bent lines illustrated in FIG. 3.

Figure 17:
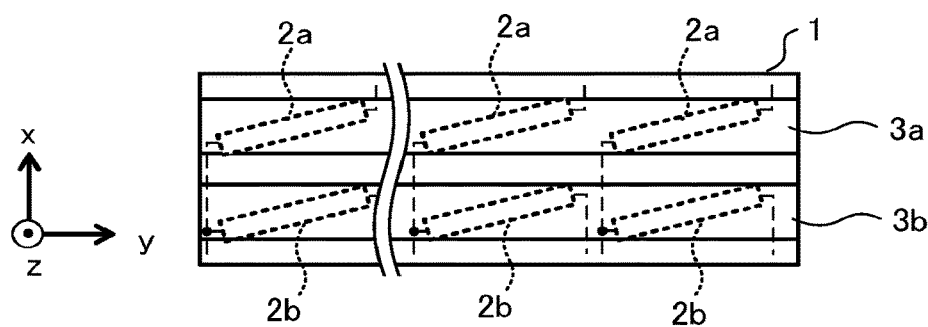
FIG. 17 is a plan view in which anisotropic magnetoresistive effect elements according to Embodiment 2 are arranged in an array.

FIG. 17 is a plan view in which anisotropic magnetoresistive effect elements according to Embodiment 2 are arranged in an array. In the unit 1 of FIG. 17, two or more of the first anisotropic magnetoresistive effect element 2a are arranged parallel to the direction of the reset line 3a, and the reset line 3a of two or more elements 2a is connected in series along a straight line. Further, two or more of the second anisotropic magnetoresistive effect element 2b are arranged parallel to the direction of the reset line 3b, and the reset line 3b of two or more elements 2b is connected in series along a straight line. The element 2a and the element 2b form a pair positioned in a direction perpendicular to the reset line 3a, and the pair is bridge-connected together. In the case of three or more of each of the elements 2a and 2b, for general applications, the spacings between the mutually adjacent elements 2a and 2b are preferably equal. Depending on the application, the spacing between the elements 2a or 2b may be varied in accordance with the targeted magnetic pattern.

Figure 18:
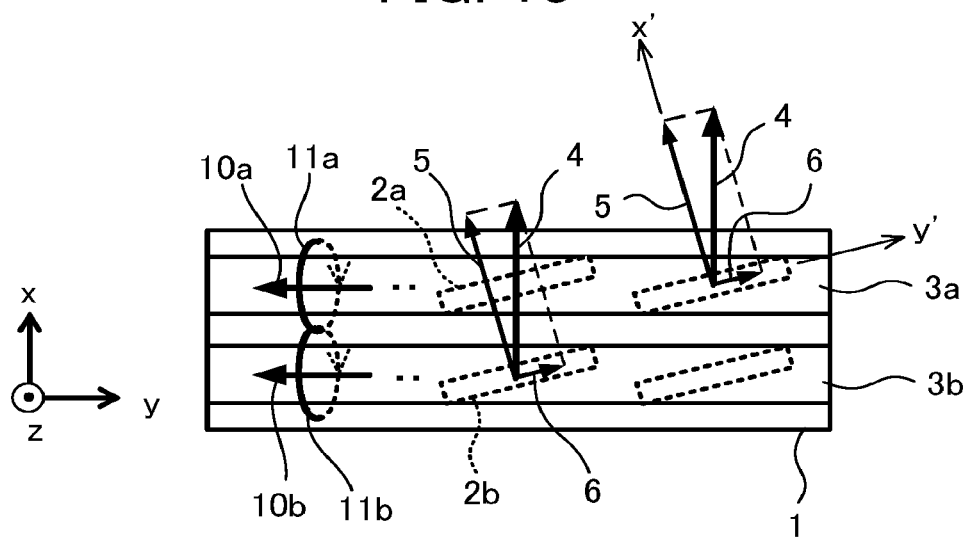
FIG. 18 illustrates a bias magnetic flux vector and a reset current of the magnetoresistive effect element unit according to Embodiment 2.

FIG. 18 illustrates a bias magnetic flux vector and a reset current of the magnetoresistive effect element unit according to Embodiment 2. In FIG. 18, the bridge wiring connecting the elements 2a and 2b is omitted.

In Embodiment 2, the same bias magnetic field is applied to all the elements 2a and 2b of the unit 1. In FIG. 18, although the bias magnetic flux vectors 4 for only one each of the upper-side element 2a and the lower-side element 2b are illustrated in order to avoid overlapping of wiring and to aid in understanding, the same bias magnetic flux vectors 4 are applied to all of the elements 2a and 2b. Although the case of two or more each of the elements 2a and 2b is illustrated in FIG. 18, the bias magnetic flux vector 4 is the same as that of the case of a single element 2a and element 2b each as illustrated in FIG. 16. The ability resolve the bias magnetic flux vector 4 into the x' component 5 of the magnetic sensing direction x' and the y' component 6 of the easy magnetization direction y' is the same as in Embodiment 1.

Figure 19A:
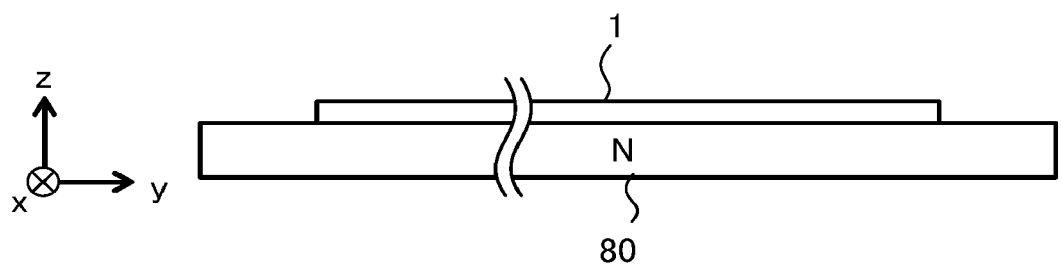
FIG. 19A is a side view illustrating an example of a magnetic circuit applying a bias magnetic field to the magnetoresistive effect element unit according to Embodiment 2.
Figure 19B:
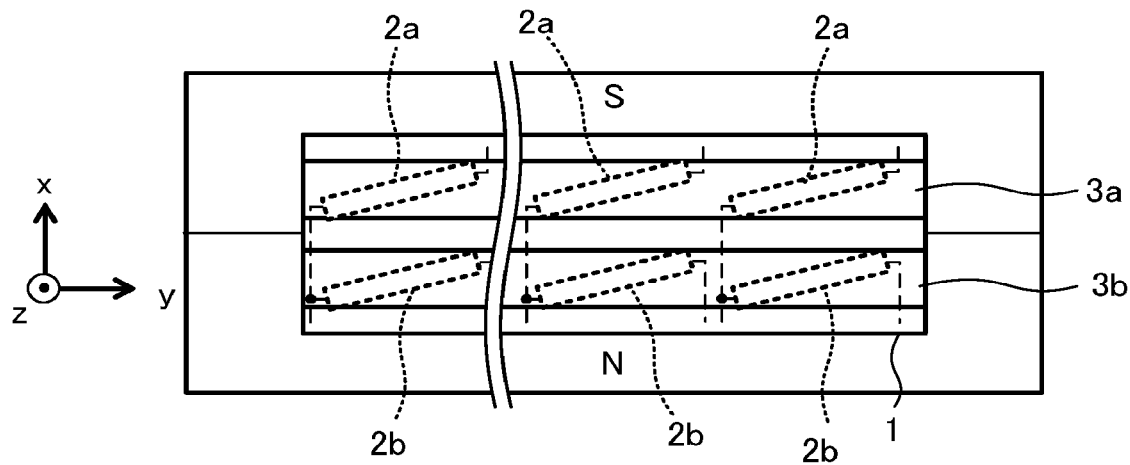
FIG. 19B is a plan view illustrating the example of the magnetic circuit applying the bias magnetic field to the magnetoresistive effect element unit according to Embodiment 2.

FIG. 19A is a side view illustrating an example of a magnetic circuit applying a bias magnetic field to the magnetoresistive effect element unit according to Embodiment 2. FIG. 19B is a plan view illustrating the example of the magnetic circuit applying the bias magnetic field to the magnetoresistive effect element unit according to Embodiment 2. In the same manner as in Embodiment 1, due to arrangement of the magnet 80 magnetized in the x-axis direction at the bottom side of the unit 1, the bias magnetic field illustrated in FIG. 18 can be applied to both the elements 2a and 2b. Although an example is illustrated here of a configuration in which the magnet 80 magnetized in the x-axis direction is arranged below the unit 1, the configuration of FIGS. 19A and 19B is not limiting, as long as the bias magnetic field illustrated in FIG. 18 can be applied. For example, a similar effect can be obtained by arrangement of a magnet magnetized in the z direction at a position below the unit 1 and offset from the center of the x-axis direction.

The behavior of the magnetization of each of the elements 2a and 2b in the case of application of the external disturbing magnetic field 9 in the configuration of FIG. 18 is the same as the behavior illustrated in FIGS. 9 and 10. If the bias conditions of the elements 2a and 2b are taken to be the same as the bias conditions of the element 2 of Embodiment 1, the reset current 10a and the reset current 10b for setting the elements 2a and 2b to the magnetization of the bias condition are each the same as the reset current 10 of FIG. 12.

When the reset current 10a of, for example, several hundred milliamps to several amps, passes through the reset line 3a in the negative y-axis direction of the element 2a, a clockwise-directed magnetic field 11a is generated around the reset line 3a as viewed in the direction of the reset current 10a. Due to location of the element 2a at the bottom side of the reset line 3a, a reset magnetic field in the negative x-axis direction is applied by the magnetic field 11a to the element 2a. At this time, the magnetization of the element 2a rotates so as to approach the positive y-axis direction from the magnetization 8c of FIG. 10, exceeds the magnetization 8a, and arrives at the magnetization 8d illustrated in FIG. 12 that is the saturation magnetization of the easy magnetization direction y'.

Upon disappearance of the magnetic field 11a, magnetization of the element 2a returns to the magnetization 8a that satisfies the bias conditions of FIG. 8. After once becoming the saturation magnetization, the magnetization of the easy magnetization direction of the element 2a then returns to the bias point '7y' on the upper curve in FIG. 7.

When the reset current 10b passes through the reset line 3b of the element 2b, a magnetic field 11b is generated, and a reset magnetic field in the negative x-axis direction can be applied to the element 2b. The magnetization of the element 2b returns to the magnetization 8a satisfying the bias conditions of FIG. 8 in the same manner as for the element 2a, and the magnetization of the easy magnetization direction of the element 2b returns to the bias point '7y' on the upper curve in FIG. 7.

In the case in which an abnormal state occurs in the above described manner, by causing the reset current 10a to flow in the reset line 3a and the reset current 10b to flow in the reset line 3b, the bias point of the easy magnetization direction y' of the elements 2a and 2b can be positioned on the curve returning from the saturation magnetization, and thus the elements 2a and 2b can be set to magnetizations that satisfy the bias conditions. This has the result of enabling output that is always stabilized and accurate. The reset line 3a is at least as wide as the width of the element 2a and the reset line 3b is at least as wide as the width of the element 2b, and thus the voltage for flow of the reset current 10 is smaller than the voltage for flow of the reset current in the reset coil of Patent Literature 1.

Further, causing flow of the required currents as the reset currents 10a and 10b for even an instant is sufficient. Further, in the case of positioning at the normal bias point 7y', even after causing flow of the reset currents 10a and 10b, the magnetization returns to the bias point 7y', and thus magnetization is unaffected by the reset currents 2a and 2b.

By adopting a configuration such that the reset current flows 10a and 10b are pulsed currents, and for example, flow each time prior to a data reading period as illustrated in FIG. 14, a state is possible in Embodiment 2 also in which accurate output is always obtainable during detection.

Although the upper-side reset line 3a and the lower-side reset line 3b are each independent in FIGS. 16 and 17, the reset line 3a and the reset line 3b can be connected in parallel, thereby enabling simultaneous flow of the reset currents 10a and 10b.

Also in Embodiment 2, the magnetoresistive effect element device can be configured that connects together multiple magnetoresistive effect element units 1. In this case, for example, each of the reset lines 3 of the units 1 can be interconnected in parallel, in series, or by a combination of in parallel and in series, thereby enabling the simultaneous flow of the reset current. In the magnetoresistive effect element device, the units 1 can be arranged in any manner in accordance with the application.

Embodiment 3

Figure 20:
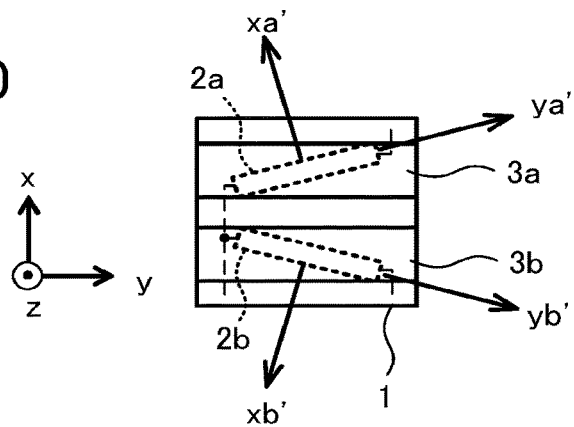
FIG. 20 is a plan view of a magnetoresistive effect element unit according to Embodiment 3 of the present disclosure.

FIG. 20 is a plan view of a magnetoresistive effect element unit according to Embodiment 3 of the present disclosure. The magnetoresistive effect element unit 1 of Embodiment 3 is equipped with two anisotropic magnetoresistive effect elements 2a and 2b that are bridge-connected together. The reset line 3a is provided for the element 2a, and the reset line 3b is provided for the element 2b. The relationship between the element 2a and the reset line 3a is the same as the relationship between the element 2 and the reset line 3 of Embodiment 1. The element 2b and the reset line 3b have mirror symmetry with respect to the element 2a and the reset line 3a.

In Embodiment 3, the second anisotropic magnetoresistive effect element 2b is arranged, in a plane that includes the magnetic sensing direction xa' and the easy magnetization direction ya' of the first magnetoresistive effect element 2a, in a direction perpendicular to the reset line 3a of the element 2a. The reset line 3b of the element 2b is parallel to the reset line 3a of the element 2a. As viewed in the direction orthogonal to both the magnetic sensing direction xa' and the easy magnetization direction ya' of the element 2a, the angle formed between the easy magnetization direction xa' of the element 2a and the reset line 3a of the element 2a, is equal in absolute value and opposite in sign of the angle formed between the easy magnetization direction xb' of the element 2b and the reset line 3b of the element 2b. That is, the elements 2a and 2b are symmetrical with respect to a plane parallel to a direction of extension of the reset line 3a. In Embodiment 3, a bridge connection is used for the elements 2a and 2b, thereby decreasing the effects of temperature variation and disturbing noise.

Also in Embodiment 3, the unit 1 has the layer structure of FIG. 2A or FIG. 2B. The layer structure of FIG. 2A is envisioned for FIG. 20. Further, the elements 2a and 2b may have configurations using the folded-over bent line resistance pattern illustrated in FIG. 3.

Figure 21:
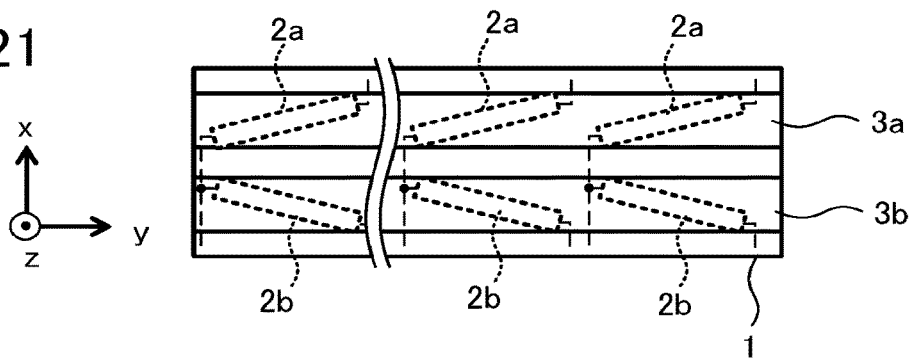
FIG. 21 is a plan view in which anisotropic magnetoresistive effect elements according to Embodiment 3 are arranged in an array.

FIG. 21 is a plan view in which anisotropic magnetoresistive effect elements according to Embodiment 3 are arranged in an array. In the unit 1 of FIG. 21, two or more of the first anisotropic magnetoresistive effect element 2a are arranged parallel to the direction of the reset line 3a, and the resets line 3a of two or more elements 2a are connected in series along a straight line. Further, two or more of the second anisotropic magnetoresistive effect element 2b are arranged parallel to the direction of the reset line 3b, and the reset lines 3b of two or more elements 2b are connected in series along a straight line. The element 2a and the element 2b form a pair positioned in a direction perpendicular to the reset line 3a, and the pair is bridge-connected together. In the case of three or more of each of the elements 2a and 2b, for general applications, the spacings between the mutually adjacent elements 2a and 2b are preferably equal. Depending on the application, the spacing of the elements 2a or 2b may be varied in accordance with the targeted magnetic pattern.

Figure 22A:
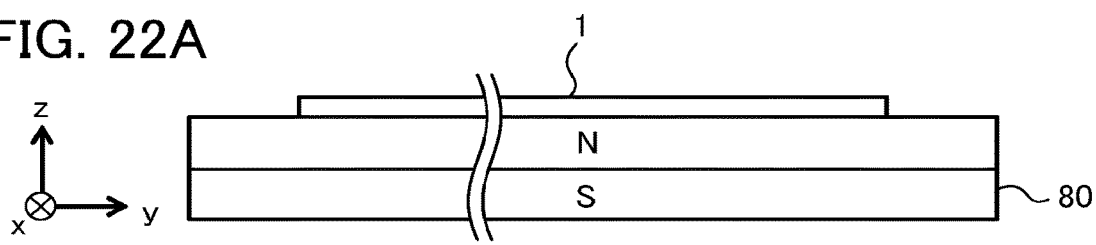
FIG. 22A is a side view illustrating an example of a magnetic circuit applying a bias magnetic field to the magnetoresistive effect element unit according to Embodiment 3.
Figure 22B:
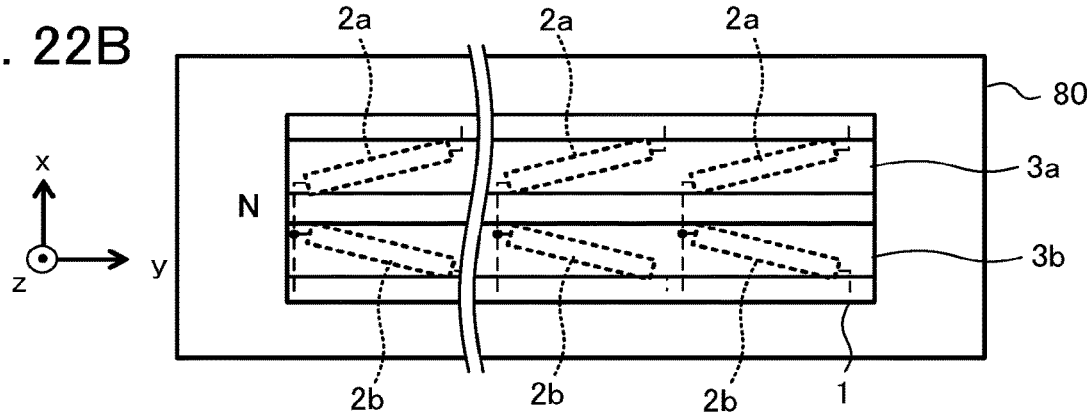
FIG. 22B is a plan view illustrating the example of the magnetic circuit applying the bias magnetic field to the magnetoresistive effect element unit according to Embodiment 3.

FIG. 22A is a side view illustrating an example of a magnetic circuit applying a bias magnetic field to the magnetoresistive effect element unit according to Embodiment 3. FIG. 22B is a plan view illustrating the example of the magnetic circuit applying the bias magnetic field to the magnetoresistive effect element unit according to Embodiment 3. By arrangement of the magnet 80 magnetized in the z-axis direction at the bottom side of the unit 1 so that the centers of the elements 2a and 2b coincide with the center of the magnet 80, the positive x-axis direction bias magnetic field is applied to the upper-side element 2a, and the negative x-axis direction bias magnetic field is applied to the lower-side element 2b. Although an example is illustrated here of a configuration in which the magnet 80 magnetized in the z-axis direction is arranged below the unit 1, this configuration is not limiting, as long as the upper-side bias magnetic field and the lower-side bias magnetic field can be applied in mutually opposite x-axis directions to the upper-side element 2a and the lower-side element 2b. For example, a similar effect can be obtained by arrangement of a combination of a magnet magnetized in the positive x-axis direction and a magnet magnetized in the negative x-axis direction, and by arrangement of the x-axis direction centers of the magnets aligned centrally below the unit 1.

Figure 23:
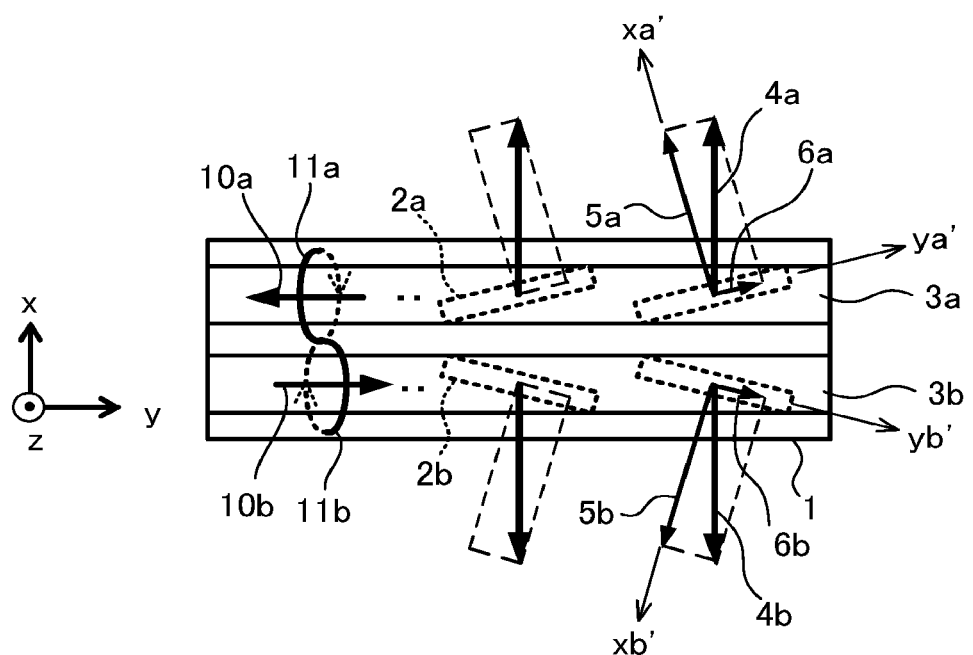
FIG. 23 illustrates a bias magnetic flux vector and a reset current of the magnetoresistive effect element unit according to Embodiment 3.

FIG. 23 illustrates the bias magnetic flux vector and a reset current of the magnetoresistive effect element unit according to Embodiment 3. In FIG. 23, the bridge wiring interconnecting the elements 2a and 2b is omitted.

In Embodiment 3, a bias magnetic field in the positive x-axis direction indicated by a bias magnetic flux vector 4a is applied to the element 2a by the magnetic circuit indicated in FIGS. 22A and 22B, and the bias magnetic field in the negative x-axis direction indicated by a bias magnetic flux vector 4b is applied to the element 2b. Although FIG. 23 illustrates a case of two or more each of the elements 2a and 2b, the bias magnetic flux vector 4a and the bias magnetic flux vector 4b are the same as in the case of one each of the elements 2a and 2b as illustrated in FIG. 20.

The bias magnetic flux vector 4a can be resolved into an xa' component 5a in the magnetic sensing direction xa' of the element 2a and a ya' component 6a in the easy magnetization direction ya'. The bias magnetic flux vector 4b can be resolved into an xb' component 5b in the magnetic sensing direction xb' of the element 2b and a yb' component 6b in the easy magnetization direction yb'. The element 2b and the bias magnetic flux vector 4b have mirror symmetry with respect to the element 2a and the bias magnetic flux vector 4a.

For the upper-side element 2a, when the external disturbing magnetic field 9 is applied in the configuration of FIG. 23, the behavior of magnetization of the element 2a is the same as illustrated in FIGS. 9 and 10. Taking the bias conditions of the element 2a to be the same as the bias conditions of the element 2 of Embodiment 1, the reset current 10a for setting the element 2a to the magnetization of the bias conditions is the same as the reset current 10 of FIG. 12.

When a reset current 10a of, for example, several hundred milliamps to several amps, flows in the reset line 3a in the negative y-axis direction, a clockwise-directed magnetic field 11a is generated around the reset line 3a for the element 2a as viewed in the direction of the reset current 10a. Due to location of the element 2a at the bottom side of the reset line 3a, a reset magnetic field in the negative x-axis direction is applied by the magnetic field 11a to the element 2a. At this time, the magnetization of the element 2a rotates so as to approach the positive y-axis direction from the magnetization 8c of FIG. 10, exceeds the magnetization 8a, and arrives at the magnetization 8d of FIG. 12 that is the saturation magnetization of the easy magnetization direction y'.

Upon disappearance of the magnetic field 11a, magnetization of the element 2a returns to the magnetization 8a that satisfies the bias conditions of FIG. 8. After once reaching positive-direction saturation magnetization, the magnetization of the easy magnetization direction of the element 2a returns to the bias point 7y' on the upper curve in FIG. 7.

The element 2b and the bias magnetic flux vector 4b have mirror symmetry with respect to the element 2a and the bias magnetic flux vector 4a, and thus the reset magnetic field required for the element 2b is in the positive x-axis direction. The reset line 3b is arranged in the positive z-axis direction of the element 2b, and thus the reset current 10b for application of the reset magnetic field to the element 2b is in the positive y-axis direction, which is opposite to the direction of the reset current 10a.

As illustrated in FIG. 23, the reset current 10b can flow in the reset line 3b, the magnetic field 11b can be generated, and the positive x-axis direction reset magnetic field can be applied to the element 2b. The magnetization of the element 2b returns to the magnetization 8a satisfying the bias conditions of FIG. 8 in the same manner as for the element 2a, and the magnetization of the easy magnetization direction of the element 2b returns to the bias point 7y' on the upper curve in FIG. 7.

In the case in which an abnormal state occurs in the above described manner, by causing the reset current 10a to flow in the reset line 3a and the reset current 10b to flow in the reset line 3b, the bias point of the easy magnetization direction y' of the elements 2a and 2b can be positioned on the curve returning from the saturation magnetization, and thus the elements 2a and 2b can be set to magnetizations that satisfy the bias conditions. This has the result of enabling output that is always stabilized and accurate. The reset line 3a is at least as wide as the width of the element 2a and the reset line 3b is at least as wide as the width of the element 2b, and thus the voltage for flow of the reset currents 10a and 10b is smaller than the voltage for flow of the reset current in the reset coil of Patent Literature 1.

Further, causing flow of the required currents as the reset currents 10a and 10b for even an instant is sufficient. Further, in the case of positioning at the normal bias point 7y', even after causing flow of the reset currents 10a and 10b, the magnetization returns to the bias point 7y', and thus the magnetization is unaffected by the reset currents 10a and 10b.

By adopting a configuration such that the reset current flows 10a and 10b are pulsed currents, and for example, flow each time prior to a data reading period as illustrated in FIG. 14, a state is possible also in Embodiment 3 in which accurate output is always obtainable during detection.

Although the upper-side reset line 3a and the lower-side reset line 3b are independent of each other in FIGS. 20 and 21, the reset line 3a and the reset line 3b may be connected back-to-back such that the reset currents 10a and 10b flow simultaneously. Further, the reset lines 3a and 3b may be sequentially connected in series in the directions of the current 10a and current 10b such that the reset currents 10a and 10b flow simultaneously.

Also in Embodiment 3, the magnetoresistive effect element device can be configured that connects together multiple magnetoresistive effect element units 1. In this case, for example, each of the reset lines 3 of the units 1 can be interconnected in parallel, in series, or by a combination of in parallel and in series, thereby enabling the simultaneous flow of the reset current. In the magnetoresistive effect element device, the units 1 can be arranged in any manner in accordance with the application.

Various types of modifications of the aforementioned embodiments are possible. For example, in Embodiment 2, bias magnetic fields may be applied that are oppositely directed for the upper-side element 2a and the bottom-side element 2b, as illustrated in FIGS. 22A and 22B. In this case, due to rotational symmetry of the elements 2a and 2b centered on the z axis, the reset magnetic fields are oppositely directed, and the reset current 10a and the reset current 10b are oppositely directed.

Further, in Embodiment 3, the upper-side element 2a and the lower-side element 2b may be directed in the same direction as illustrated in FIGS. 19A and 19B, and for example, the bias magnetic field may be applied in the positive x-axis direction. In this case, the relationship between the element 2b and the bias magnetic field is the same as that when viewing the element 2a in FIG. 23 from the negative z-axis side, that is, from the backside of the page, and thus the reset magnetic field of the element 2b is in the negative x-axis direction, and the reset current 10b and the reset current 10a have the same direction.

Although in the aforementioned embodiments the use of the unit 1 is envisioned in the range of positive-direction applied magnetic field in the magnetization characteristics of FIG. 7, the sign of the applied magnetic field can be reversed, and use is possible in the range of negative-direction applied magnetic field. In this case, the directions of the vectors in each of the drawings may be considered to be reversed.

Figure 24:
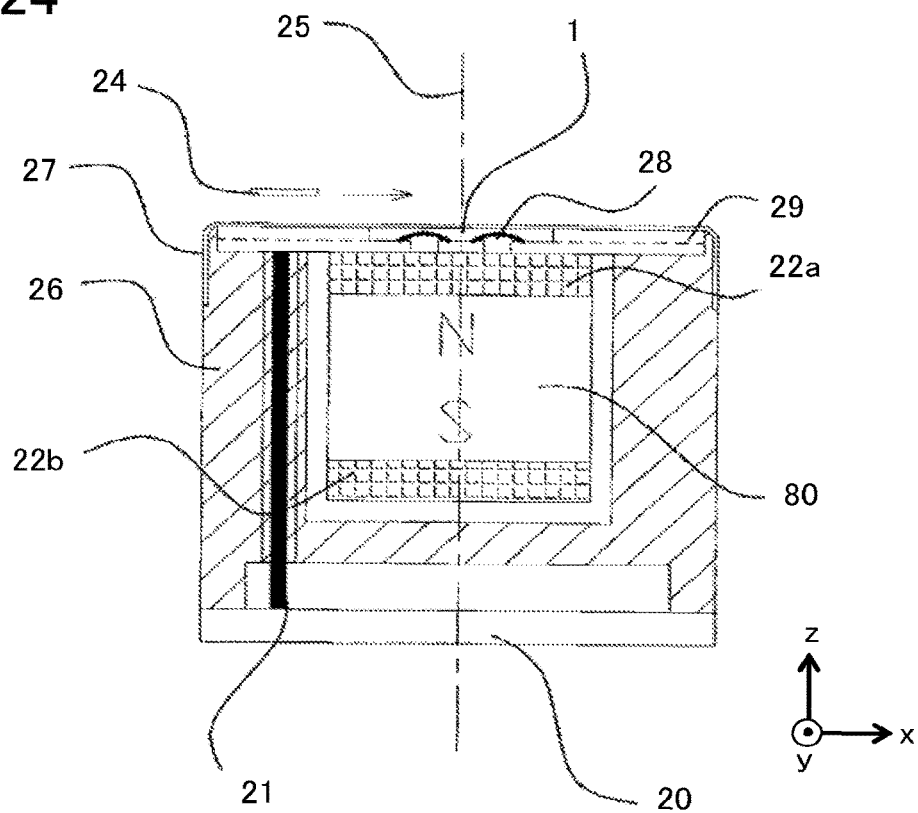
FIG. 24 is a view of a cross section, taken perpendicular to a main scanning direction, of a magnetic sensor device using the magnetoresistive effect element unit according to Embodiments 1 to 3 of the present disclosure.
Figure 25:
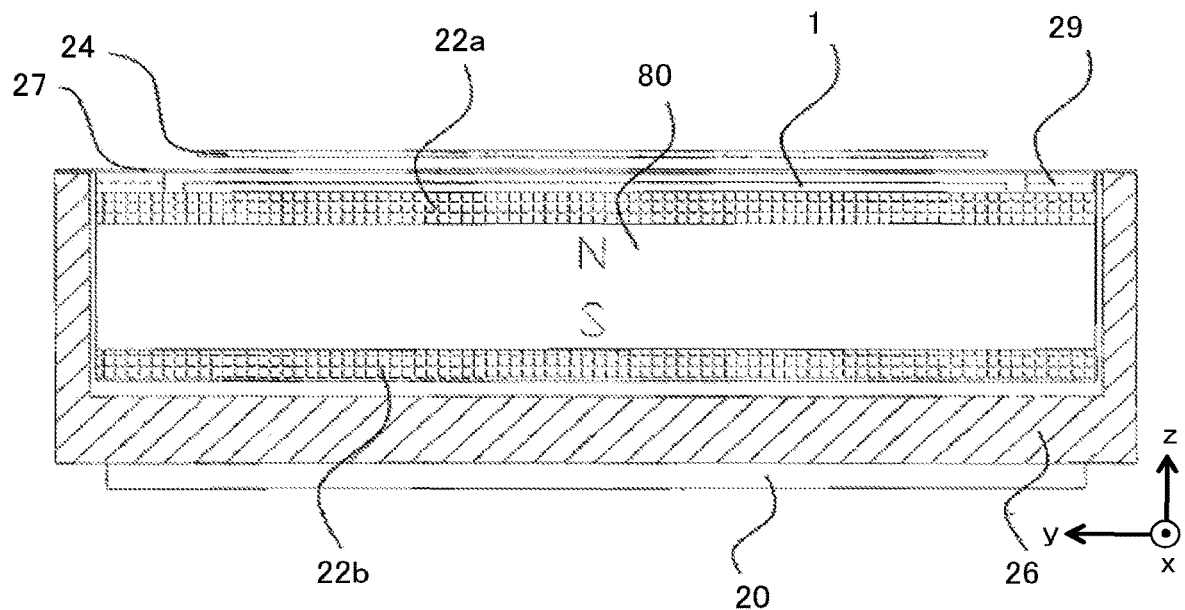
FIG. 25 is a cross sectional view of the magnetic sensor device of FIG. 24 as viewed from an ejection direction of a to-be-detected object.

FIG. 24 is a view of a cross section, taken perpendicular to a main scanning direction, of the magnetic sensor device using the magnetoresistive effect element unit according to Embodiments 1 to 3 of the present disclosure. FIG. 25 is a cross sectional view of the magnetic sensor device of FIG. 24 as viewed from an ejection direction of a to-be-detected object.

Examples of the to-be-detected object 24 include paper currency or negotiable securities printed with a magnetic member such as magnetic ink, and for example, the to-be-detected object 24 is a page-like printing medium on which is formed a minute magnetic pattern. The magnetic sensor device is a device that detects, for example, the minute magnetic pattern printed on paper currency. The magnetic sensor device is equipped with the magnetoresistive effect element unit 1 of the Embodiments 1, 2, or 3. The to-be-detected object 24 is conveyed in the positive x direction of FIG. 24. The directions of the x axis, y axis, and z axis relative to the unit 1 are the same as the directions of the coordinate systems of FIG. 15, 17, or 21. The unit 1 with which the magnetic sensor device is equipped is not limited to a single unit, and a magnetoresistive effect element device may be provided that interconnects multiple units 1.

The magnet 80 is a permanent magnet magnetized in the z-axis direction and forms a magnetic field generation unit. The magnet 80, for example, has a north pole on the side of the conveyance path of the to-be-detected object 24, and has a south pole on the side opposite to the to-be-detected object 24 side. A centerline 25 indicates the x-axis direction centerline of the magnet 80. In FIGS. 24 and 25, the arrangement of magnetic poles is as illustrated in FIGS. 22A and 22B, although the arrangement of magnetic poles of FIGS. 19A and 19B is also possible.

A yoke 22a and a yoke 22b are formed as soft magnetic members. The yoke 22a is arranged at an upper face, which is at the to-be-detected object 24 side of the magnet 80, and the yoke 22b is arranged at the lower face, which is at the side of the magnet 80 opposite to the to-be-detected object 24 side. The yoke 22a and the yoke 22b form parts of the magnetic field generation unit. Although the yoke 22b is arranged with the objective of causing a concentration of the magnetic flux of the magnet 80, the yoke 22b may be omitted. Although the yoke 22a is arranged with the objective of stabilizing the direction of the magnetic flux of the magnet 80, the yoke 22a may be omitted.

The anisotropic magnetoresistive effect element 2 that detects the change of magnetic flux as a change in resistivity is provided on the upper face that is at the to-be-detected object 24 side of the yoke 22a, and the magnetoresistive effect element unit 1 is mounted thereon. A board 29 formed of resin is mounted on the upper face of the yoke 22a and surrounds the unit 1. The yoke 22a also performs the role of supporting the unit 1. In the case in which the yoke 22a is arranged with the objective of supporting the unit 1, a non-magnetic member may be used as a support member of the unit 1. The support member of the unit 1 may be made of a non-magnetic metal, or may be formed as a portion of the board 29 formed from resin. Further, in the case of omission of the yoke 22a, the unit 1 may be arranged directly on the magnet 80. The power supply, ground, and signal line terminals of the board 29 and the unit 1 are connected by metal wire 28. For the board 29 and the unit 1, the conveyance path side at which the to-be-detected object 24 is conveyed is covered by a metal shield plate 27. The metal shield plate 27 passes the magnetic field lines without magnetization of the metal shield plate 27. A signal processing board 20 is arranged at the lower portion at the side of the housing 26 opposite to the to-be-detected object 24 side. The board 29 and the signal processing board 20 are connected by a cable 21.

The unit 1 is fixed by an adhesive or the like to the surface of the yoke 22a such that the unit 1 is surrounded by the board 29. Electrodes of the unit 1 are connected by metal wires 28 to electrodes arranged on the board 29. Encapsulation by a resin may be used to protect the unit 1 and the metal wire 28. The unit 1 is arranged such that the direction of extension of the reset lines 3, 3a, and 3b of the unit 1 is the reading width-wise direction, that is, the main scanning direction. In the case of the unit 1 of Embodiment 2 or 3, the elements 2a and 2b that are bridge-connected together are arranged in series in the conveyance direction of the to-be-detected object 24.

The elements 2a and 2b adjacent to each other in the conveyance direction of the to-be-detected object 24 are connected in common at one end and are connected in series, and the series connection point between the elements 2a and 2b is connected to the signal processing circuit mounted on the signal processing board 20. The other end of the element 2a is connected, for example, to a direct current power supply voltage Vcc, and the other end of the element 2b is connected to a direct current ground GND. The bridge center of the elements 2a and 2b is arranged on the centerline 25 illustrated in FIG. 24.

Figure 26:
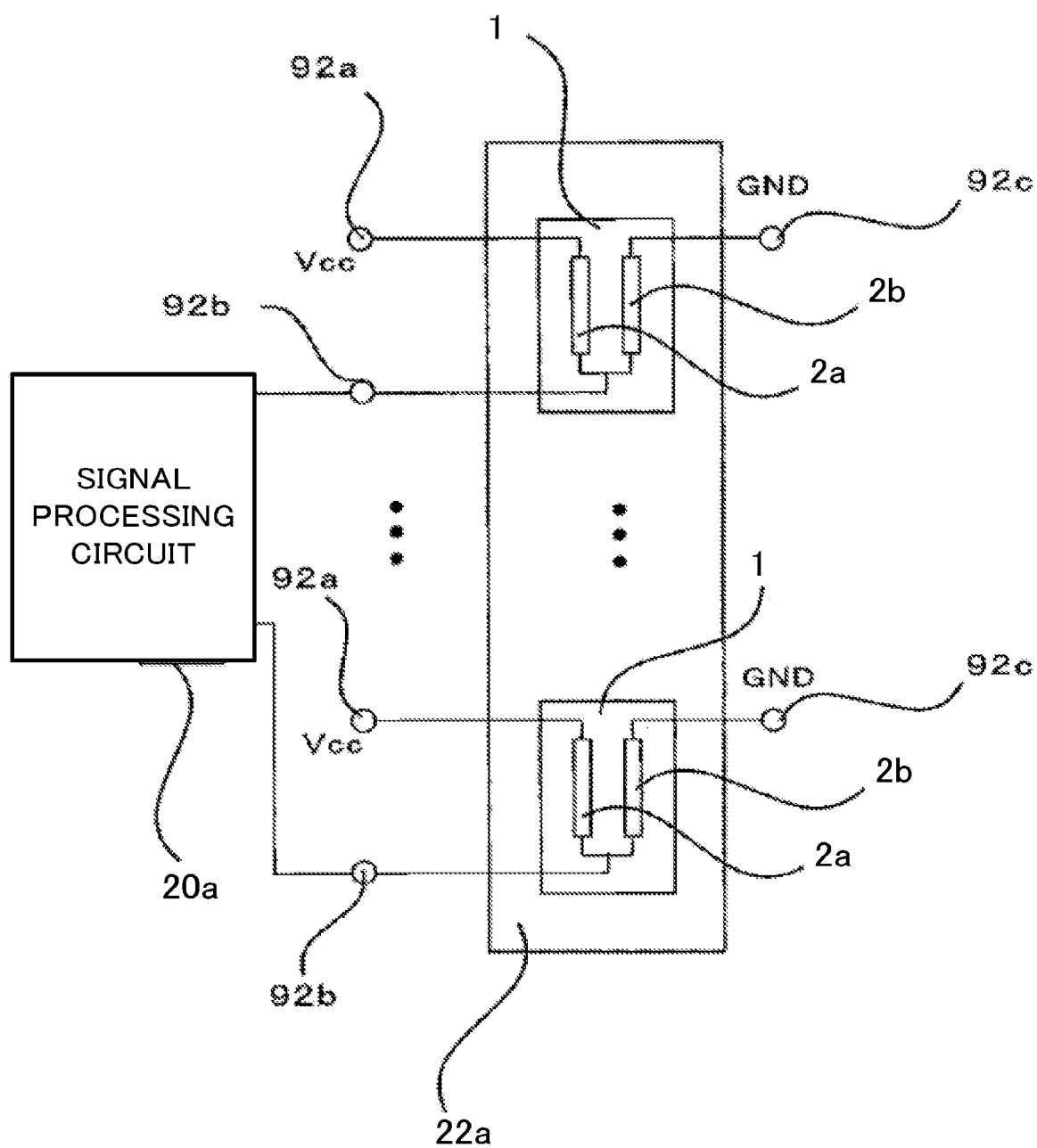
FIG. 26 is a connection diagram illustrating state of connections between an external circuit and the magnetoresistive effect element unit according to Embodiment 2 or 3 of the present disclosure.

FIG. 26 is a connection diagram illustrating state of connections between an external circuit and the magnetoresistive effect element unit according to Embodiment 2 or 3 of the present disclosure. In FIG. 26, although the elements 2a and 2b are drawn vertically aligned, the elements are each arranged tilted with respect to the main scanning direction. The elements 2a and 2b are parallel to each other in Embodiment 2, and in Embodiment 3, the elements 2a and 2b are arranged symmetrically with respect to a line parallel to the main scanning direction.

The elements 2a and 2b are connected in series between the direct current power supply voltage Vcc and the direct current ground GND. A signal processing circuit 20a mounted on the signal processing board 20 for processing the signal is connected to the series-connection point between the elements 2a and 2b. The direct current power supply voltage Vcc is connected to an external pad 92a, the signal processing circuit 20a is connected to an external pad 92b, and the direct current ground GND is connected to an external pad 92c. That is, the series-connection point between the elements 2a and 2b, which are adjacent to each other in the conveyance direction of the to-be-detected object 24, is connected via the external pad 92b to the signal processing circuit 20a. The other end of the element 2a is connected via the external pad 92a to the direct current power supply voltage Vcc. The other end of the element 2b is connected via the external pad 92c to the direct current ground GND.

Figure 27:
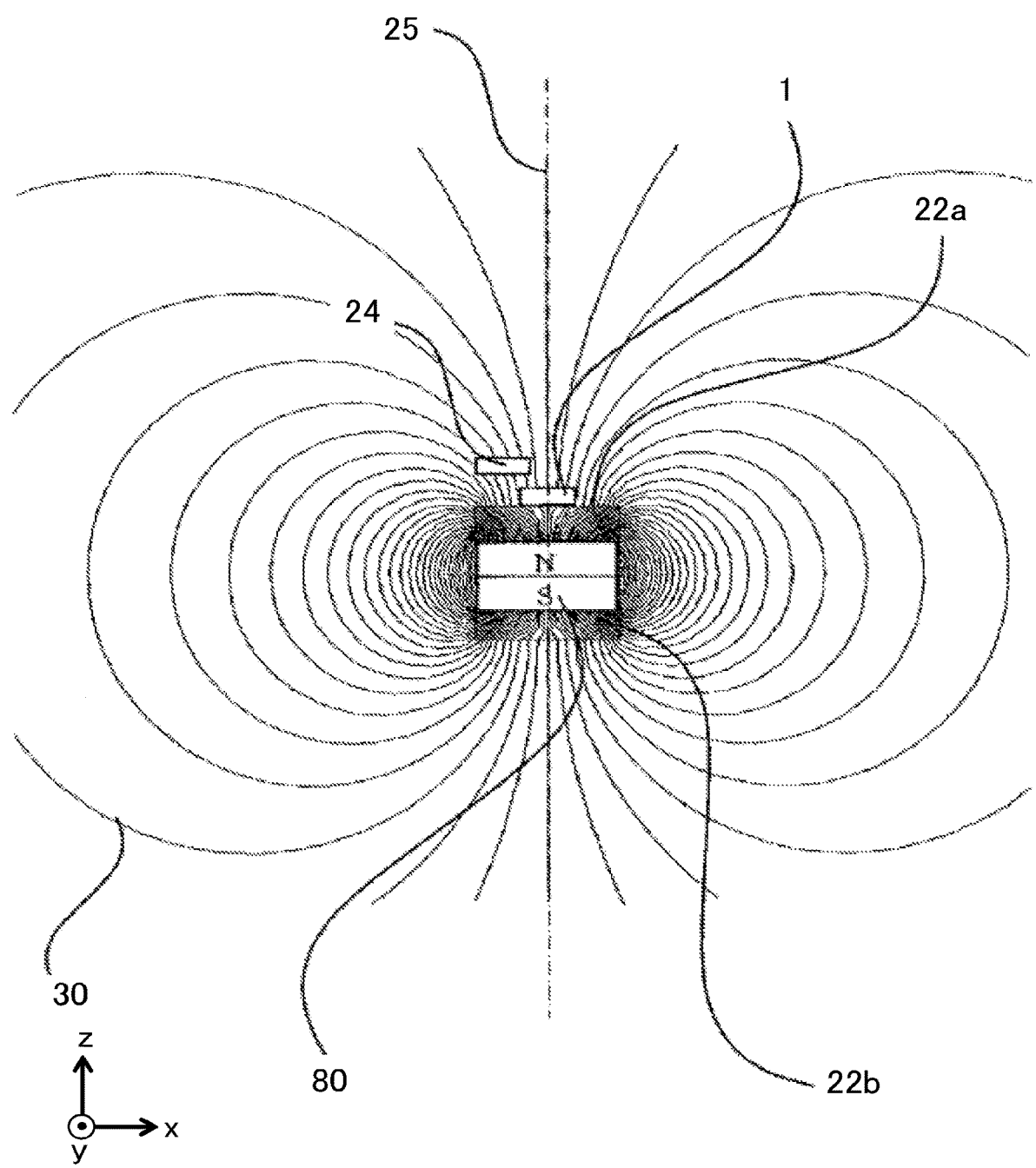
FIG. 27 is a view of magnetic figure generated from a magnet and yoke of the magnetic sensor device of FIG. 24.

FIG. 27 is a view of magnetic figure generated from a magnet and yoke of the magnetic sensor device of FIG. 24. Further, in order to describe the relationship between the magnetic field lines and the element in FIG. 27, required elements are illustrated, and other elements are omitted.

In FIG. 27, the magnetic field lines 30 emitted from the north pole of the magnet as viewed in the xz plane pass through the yoke 22a arranged at the north pole side of the magnet, and flow out to the exterior of the magnet and the yoke 22a from an xy face and a yz face of the yoke 22a. The magnetic field lines 30 emitted to the exterior of the magnet and the yoke 22a flow into the yoke 22b from an xy face and a yz face of the yoke 22b that is arranged at the south pole side of the magnet. The magnetic field lines 30 flowing into the yoke 22b pass through the yoke 22b and flow into the south pole of the magnet.

Due to the characteristic of the magnetic field lines that is entering the pole faces of the magnetic member perpendicularly, as illustrated in FIG. 27, an x-axis direction magnetic flux density component Bx is extremely small in the vicinity of the surface of the yoke 22a, and the main component is a magnetic flux density component Bz in the z direction that is the magnetization direction of the magnet. The unit 1 is arranged at the surface of the yoke 22a where a z-axis direction magnetic flux density component Bz has a strong magnetic field strength and the x-direction magnetic flux density component Bx is small. The to-be-detected object 24 passes through the position where the magnetic flux density component Bz of the magnetization direction of the magnet has high magnetic field strength such that the to-be-detected object 24 intersects the magnetic field of the magnetization direction of the magnet.

The center between the elements 2a and 2b of the unit 1 is positioned on the centerline 25 of the magnet 80 and the yoke 22a. In the vicinity of the positions where the elements 2a and 2b of the unit 1 are arranged, the main component of the magnetic field lines 30 in FIG. 27 is a component directed toward the z axis from the north pole of the magnet that has an intersecting magnetic field that intersects the conveyance direction.

Figure 28A:
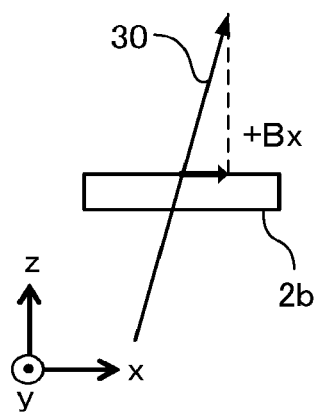
FIG. 28A is a magnetic field vector diagram of a magnetoresistive effect element on a downstream side magnetic sensor device of FIG. 24.

FIG. 28A is a magnetic field vector diagram of the magnetoresistive effect element on the downstream side magnetic sensor device of FIG. 24. FIG. 28A corresponds to the element 2b. The magnetic field vector at each point of the magnetic field lines 30 is a vector directed linearly along the magnetic field lines 30 at the point, and thus the magnetic field vectors are indicated by the same reference sign 30 as the magnetic field lines 30. As illustrated in FIG. 27, the magnetic field vector 30 is tilted somewhat in the conveyance positive x-axis direction from the z-axis direction at the top of the element 2b, and thus the positive x-axis direction component Bx of the magnetic flux that is opposite to the conveyance direction is used as the bias magnetic flux of the element 2b.

Figure 28B:
FIG. 28B is a magnetic field vector diagram illustrating approach of a to-be-read medium to the downstream side magnetoresistive effect element.
Figure 28B:
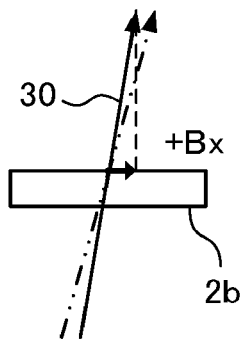
Figure 28C:
FIG. 28C is a magnetic field vector diagram illustrating separation of the to-be-read medium from the downstream side magnetoresistive effect element.
Figure 28C:
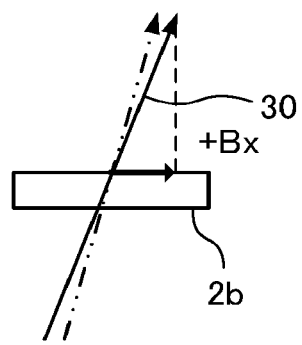

FIG. 28B is a magnetic field vector diagram illustrating approach of a to-be-read medium to the downstream side magnetoresistive effect element. FIG. 28C is a magnetic field vector diagram illustrating separation of the to-be-read medium from the downstream side magnetoresistive effect element. In FIGS. 28B and 28C, the alternate long and short dash line arrows indicate the magnetic field vector prior to approach of the to-be-detected object 24, that is, indicate the magnetic field vector 30 of FIG. 28A.

When the to-be-detected object 24 having the magnetic pattern approaches the element 2b, as illustrated in FIG. 28B, the magnetic field vector 30 tilts toward the magnetic pattern side, that is, toward the negative x-axis direction opposite to the conveyance direction, and thus the conveyance direction magnetic flux density component Bx becomes small for the element 2b. When the to-be-detected object 24 separates from the element 2b, as illustrated in FIG. 28C, the magnetic field vector 30 tilts toward the magnetic pattern side, that is, toward the conveyance positive x-axis direction, and thus the conveyance direction magnetic flux density component Bx becomes large. Thus the resistivity of the element 2b sensitive to the x-axis direction component changes due to passage of the magnetic pattern, and the magnetic pattern can be sensed.

Figure 29A:
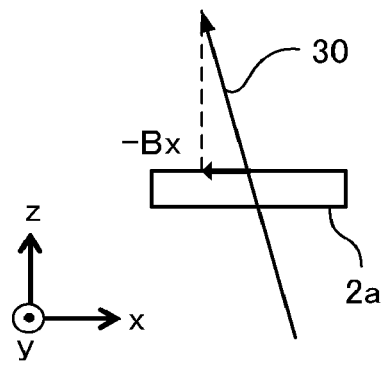
FIG. 29A is a magnetic field vector diagram illustrating a magnetoresistive effect element of an upstream side of the magnetic sensor device of FIG. 24.

FIG. 29A is a magnetic field vector diagram illustrating a magnetoresistive effect element of an upstream side of the magnetic sensor of FIG. 24. FIG. 29A corresponds to the device 2a of the unit 1. As illustrated in FIG. 29A, the magnetic field vector 30 above the element 2a tilts from the z-axis direction just slightly in the negative x-axis direction opposite to the conveyance direction, and thus a magnetic flux density component −Bx (negative x-axis direction) of the side opposite to the conveyance direction and of the magnetic flux density indicated by the magnetic field vector 30 is used as the bias magnetic flux of the element 2a.

Figure 29B:
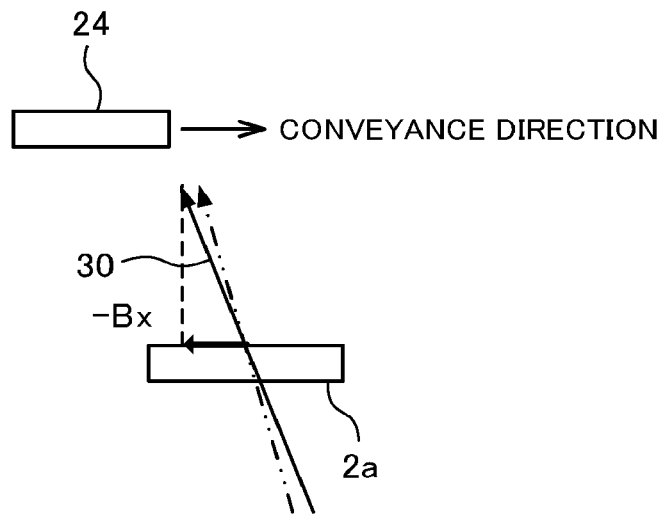
FIG. 29B is a magnetic field vector diagram illustrating approach of the to-be-read medium to the upstream side magnetoresistive effect element.
Figure 29C:
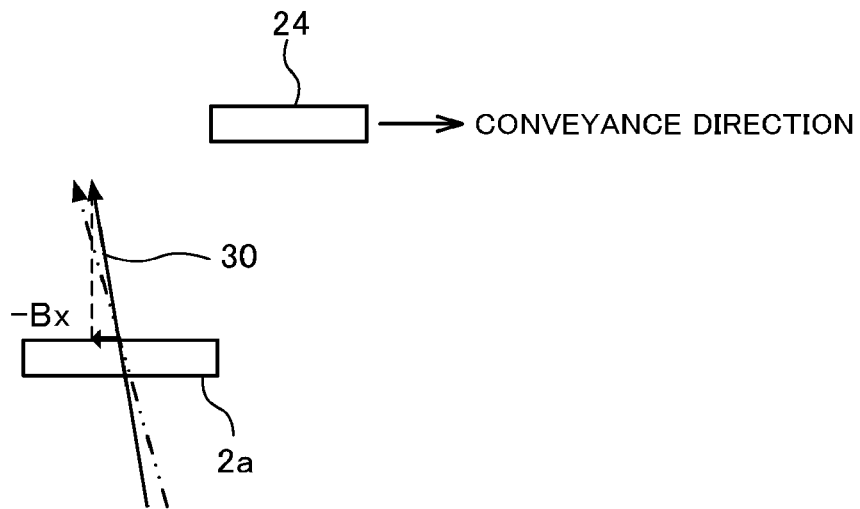
FIG. 29C is a magnetic field vector diagram illustrating separation of the to-be-read medium from the upstream side magnetoresistive effect element.

FIG. 29B is a magnetic field vector diagram illustrating approach of the to-be-read medium to the upstream side magnetoresistive effect element. FIG. 29C is a magnetic field vector diagram illustrating separation of the to-be-read medium from the upstream side magnetoresistive effect element. In FIGS. 29B and 29C, the alternate long and short dash line arrows indicate the magnetic field vector prior to approach of the to-be-detected object 24, that is, indicate the magnetic field vector 30 of FIG. 29A.

For the element 2a, when the to-be-detected object 24 having the magnetic pattern approaches the element 2a, as illustrated in FIG. 29B, the magnetic field vector tilts toward the magnetic pattern side, that is, toward the negative x-axis direction opposite to the conveyance direction, and thus the conveyance direction-opposite magnetic flux density component −Bx becomes large. When the to-be-detected object 24 separates from the element 2a, as illustrated in FIG. 29C, the magnetic field vector 30 tilts toward the magnetic pattern side, that is, toward the conveyance positive x-axis direction, and thus the conveyance direction-opposite magnetic flux density component −Bx becomes small. Thus the resistivity of the element 2a sensitive to the x-axis direction component changes due to passage of the magnetic pattern, and the magnetic pattern can be sensed.

The point of series connection between the elements 2a and 2b is positioned on the centerline 25, and the elements 2a and 2b are arranged at positions symmetrical with respect to the centerline 25, and thus the elements 2a and 2b are affected in the aforementioned manner oppositely of each other. Thus the bridge output of the elements 2a and 2b doubles, and an output is obtained that is twice the output obtained by a row of the elements 2.

In the case in which the elements 2 are a single row of units 1, the elements 2 are arranged at the position of FIG. 28A or the position of FIG. 29A. That is, the element 2 is arranged offset to the downstream side of the conveyance direction relative to the centerline 25 of the magnet 80 and the yoke 22a, or is arranged offset in the upstream side of the conveyance direction relative to the centerline 25 of the magnet 80 and the yoke 22a. In the case of arrangement of the device of one of Embodiment 1 to 3 such that the reset line 3, 3a, or 3b is parallel to the main scanning direction, the easy magnetization direction y', ya', or yb' of the element 2, 2a, or 2b is tilted from the main scanning direction y-axis. In this case, as illustrated in FIGS. 4, 18, and 23, the magnetic field stabilized in the easy magnetization direction y, ya', or yb' (that is, the y' component 6, the ya' component 6a, or the yb' component 6b) is applied respectively to the element 2, 2a, or 2b by the bias magnetic field 4, 4a, or 4b applied in the x-axis direction that is the conveyance direction. Thus as illustrated in FIG. 7, the hysteresis characteristics of the elements 2, 2a, and 2b are suppressed, and stabilized output can be obtained.

In the case in which the magnetoresistive effect elements 2, 2a, and 2b have the meandering-shaped pattern illustrated in FIG. 3, the resistivity of the elements 2, 2a, and 2b increases relative to the resistivity of a rectangular pattern, thereby lowering consumption of current. Further, due to spreading of the apparent pattern width as viewed in the magnetic sensing direction of the elements 2, 2a, and 2b, the detection sensitivity of the magnetoresistive effect element unit increases.

For each increment of a prescribed distance of conveyance of the to-be-detected object 24, the magnetic sensor device, in synchrony with the conveyance of the to-be-detected object 24, reads a change of the resistivity of the element 2, 2a, or 2b of the unit 1 for a single main scan line, and outputs as magnetic value of the magnetic pattern a magnetic field change calculated from the change of the resistivity. The operation of reading the resistivity for the single main scan line, for example, is performed in the data reading period of FIG. 14. For example, each time the resistivity is read for a single main scan line, the reset current 10, 10a, or 10b is supplied to the unit 1, and the element 2, 2a, or 2b is reset. Such operation enables the obtaining of output that is always stabilized and accurate.

The timing of the supplying of the reset current 10, 10a, or 10b to the unit 1 is not limited to once per single main scan line, and the resetting may be performed each time upon reading of a prescribed line count, or alternatively, the resetting may be performed once each time a single to-be-detected object 24 is read.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-012689, filed on Jan. 27, 2017, the entire disclosure of which is incorporated by reference herein.

REFERENCE SIGNS LIST

1 Magnetoresistive effect element unit
2, 2a, 2b Anisotropic magnetoresistive effect element
3, 3a, 3b Reset line
4, 4a, 4b Bias magnetic flux vector
5 x' component
5a xa' component
5b xb' component
6 y' component
6a ya' component
6b yb' component
7x', 7y' Bias point
7y'' Bias magnetization
8a, 8b, 8c, 8d Magnetization
9 External disturbing magnetic field
10, 10a, 10b Reset current
11, 11a, 11b Magnetic field
15 Linear pattern
17 Connecting pattern
20 Signal processing board
20a Signal processing circuit
21 Cable
22a, 22b Yoke
24 To-be-detected object
25 Centerline
26 Housing
27 Metal shield plate
28 Metal wire
29 Board
30 Magnetic field line (magnetic field vector)
80 Magnet
92a, 92b, 92c External pad

The invention claimed is:

1. A magnetoresistive effect element unit comprising:
a first anisotropic magnetoresistive effect element;
a conductive first reset line that, as viewed in a direction orthogonal to both a magnetic sensing direction and an easy magnetization direction of the first anisotropic magnetoresistive effect element, passes through a center of the first anisotropic magnetoresistive effect element, extends in a direction inclined from the easy magnetization direction so as to form an angle of 45° or less with the easy magnetization direction, is parallel to a plane including the magnetic sensing direction and the easy magnetization direction, the magnetic sensing direction being perpendicular to the easy magnetization direction,
and has a width that covers an entirety of the first anisotropic magnetoresistive effect element;
a second anisotropic magnetoresistive effect element disposed, in a plane including the magnetic sensing direction and the easy magnetization direction of the first anisotropic magnetoresistive effect element, at a position in a direction perpendicular the direction of extension of the first reset line of the first anisotropic magnetoresistive effect element, and in parallel to the first anisotropic magnetoresistive effect element; and
a conductive second reset line that, as viewed in the direction orthogonal to both the magnetic sensing direction and the easy magnetization direction of the first anisotropic magnetoresistive effect element, passes through a center of the second anisotropic magnetoresistive effect element, is parallel to the first reset line, and has a width that covers an entirety of the second anisotropic magnetoresistive effect element,
wherein the first anisotropic magnetoresistive effect element is bridge-connected to the second anisotropic magnetoresistive effect element.

2. The magnetoresistive effect element unit according to claim 1, wherein
the first anisotropic magnetoresistive effect element is two or more first anisotropic magnetoresistive effect elements,
the first reset line is two or more first reset lines, each first reset line corresponding to one of the first anisotropic magnetoresistive effect elements,
the first anisotropic magnetoresistive effect elements are arrayed mutually parallel to each other and in a direction of extension that is the same for the first reset lines,
the first reset lines of the first anisotropic magnetoresistive effect elements are connected in series along a straight line,
the second anisotropic magnetoresistive effect element is two or more second anisotropic magnetoresistive effect elements,
the second reset line is two or more second reset lines, each second reset line corresponding to one of the second anisotropic magnetoresistive effect elements,
the second anisotropic magnetoresistive effect elements are arrayed mutually parallel to each other and in a direction of extension that is the same for the second reset lines, and
the second reset lines of the second anisotropic magnetoresistive effect elements are connected in series along a straight line.

3. The magnetoresistive effect element unit according to claim 2, wherein
the first anisotropic magnetoresistive effect element comprises a folded-over line resistance pattern; and
the second anisotropic magnetoresistive effect element comprises a folded-over line resistance pattern.

4. A magnetoresistive effect element device comprising:
two or more of the magnetoresistive effect element unit according to claim 3,
for each of the magnetoresistive effect element units, the reset line of the magnetoresistive effect element unit is connected to a reset line of another magnetoresistive effect element unit.

5. A magnetoresistive effect element device comprising:
two or more of the magnetoresistive effect element unit according to claim 2, for each of the magnetoresistive effect element units, the reset line of the magnetoresistive effect element unit is connected to a reset line of another magnetoresistive effect element unit.

6. The magnetoresistive effect element unit according to claim 1, wherein
the first anisotropic magnetoresistive effect element comprises a folded-over line resistance pattern; and
the second anisotropic magnetoresistive effect element comprises a folded-over line resistance pattern.

7. A magnetoresistive effect element device comprising:
two or more of the magnetoresistive effect element unit according to claim 6,
for each of the magnetoresistive effect element units, the reset line of the magnetoresistive effect element unit is connected to a reset line of another magnetoresistive effect element unit.

8. A magnetoresistive effect element device comprising:
two or more of the magnetoresistive effect element unit according to claim 1,
for each of the magnetoresistive effect element units, the reset line of the magnetoresistive effect element unit is connected to a reset line of another magnetoresistive effect element unit.

9. A magnetoresistive effect element unit comprising:
a first anisotropic magnetoresistive effect element;
a conductive first reset line that, as viewed in a direction orthogonal to both a magnetic sensing direction and an easy magnetization direction of the first anisotropic magnetoresistive effect element, passes through a center of the first anisotropic magnetoresistive effect element, extends in a direction inclined from the easy magnetization direction so as to form an angle of 45° or less with the easy magnetization direction, is parallel to a plane including the magnetic sensing direction and the easy magnetization direction, and has a width that covers an entirety of the first anisotropic magnetoresistive effect element, the magnetic sensing direction being perpendicular to the easy magnetization direction;
a second anisotropic magnetoresistive effect element is disposed, in a plane including the magnetic sensing direction and the easy magnetization direction of the first anisotropic magnetoresistive effect element, at a position in a direction perpendicular the direction of extension of the first reset line of the first anisotropic magnetoresistive effect element, and symmetrically to the first anisotropic magnetoresistive effect element with respect to a plane parallel to the direction of extension of the first reset line; and
a conductive second reset line that, as viewed in the direction orthogonal to both the magnetic sensing direction and the easy magnetization direction of the first anisotropic magnetoresistive effect element, passes through a center of the second anisotropic magnetoresistive effect element, is parallel to the first reset line, and has a width that covers an entirety of the second anisotropic magnetoresistive effect element,
wherein the first anisotropic magnetoresistive effect element is bridge-connected to the second anisotropic magnetoresistive effect element.

10. The magnetoresistive effect element unit according to claim 9, wherein
the first anisotropic magnetoresistive effect element is two or more first anisotropic magnetoresistive effect elements,
the first reset line is two or more first reset lines, each first reset line corresponding to one of the first anisotropic magnetoresistive effect elements,
the first anisotropic magnetoresistive effect elements are arrayed mutually parallel to each other and in a direction of extension that is the same for the first reset lines,
the first reset lines of the first anisotropic magnetoresistive effect elements are connected in series along a straight line,
the second anisotropic magnetoresistive effect element is two or more second anisotropic magnetoresistive effect elements,
the second reset line is two or more second reset lines, each second reset line corresponding to one of the second anisotropic magnetoresistive effect elements,
the second anisotropic magnetoresistive effect elements are arrayed mutually parallel to each other and in a direction of extension that is the same for the second reset lines, and
the second reset lines of the second anisotropic magnetoresistive effect elements are connected in series along a straight line.

11. The magnetoresistive effect element unit according to claim 10, wherein
the first anisotropic magnetoresistive effect element comprises a folded-over line resistance pattern; and
the second anisotropic magnetoresistive effect element comprises a folded-over line resistance pattern.

12. A magnetoresistive effect element device comprising:
two or more of the magnetoresistive effect element unit according to claim 11,
for each of the magnetoresistive effect element units, the reset line of the magnetoresistive effect element unit is connected to a reset line of another magnetoresistive effect element unit.

13. A magnetoresistive effect element device comprising:
two or more of the magnetoresistive effect element unit according to claim 10,
for each of the magnetoresistive effect element units, the reset line of the magnetoresistive effect element unit is connected to a reset line of another magnetoresistive effect element unit.

14. The magnetoresistive effect element unit according to claim 9, wherein
the first anisotropic magnetoresistive effect element comprises a folded-over line resistance pattern; and
the second anisotropic magnetoresistive effect element comprises a folded-over line resistance pattern.

15. A magnetoresistive effect element device comprising:
two or more of the magnetoresistive effect element unit according to claim 14,
for each of the magnetoresistive effect element units, the reset line of the magnetoresistive effect element unit is connected to a reset line of another magnetoresistive effect element unit.

16. A magnetoresistive effect element device comprising:
two or more of the magnetoresistive effect element unit according to claim 9,
for each of the magnetoresistive effect element units, the reset line of the magnetoresistive effect element unit is connected to a reset line of another magnetoresistive effect element unit.

* * * * *